(12) United States Patent
Alcoe

(10) Patent No.: US 7,014,094 B2
(45) Date of Patent: Mar. 21, 2006

(54) METHOD OF REFORMING REFORMABLE MEMBERS OF AN ELECTRONIC PACKAGE AND THE RESULTANT ELECTRONIC PACKAGE

(75) Inventor: David J. Alcoe, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/221,137

(22) Filed: Sep. 7, 2005

(65) Prior Publication Data
US 2006/0005986 A1    Jan. 12, 2006

Related U.S. Application Data

(62) Division of application No. 09/300,783, filed on Apr. 27, 1999, now Pat. No. 6,583,354.

(51) Int. Cl.
*B23K 31/02* (2006.01)
(52) U.S. Cl. ................... 228/180.22; 438/613
(58) Field of Classification Search ............... 174/52.1; 228/180.22; 257/738; 438/613
See application file for complete search history.

(56) References Cited
U.S. PATENT DOCUMENTS

| | | | |
|---|---|---|---|
| 3,517,434 A | 6/1970 | Shaver | 29/502 |
| 5,060,844 A | 10/1991 | Behun et al. | 228/180.2 |
| 5,147,084 A | 9/1992 | Behun et al. | 228/180.2 |
| 5,639,416 A | 6/1997 | Pennisi et al. | 264/571 |
| 5,844,316 A * | 12/1998 | Mallik et al. | 257/738 |
| 6,030,889 A * | 2/2000 | Aulicino et al. | 438/613 |
| 6,325,280 B1 * | 12/2001 | Murphy | 228/246 |
| 6,759,860 B1 * | 7/2004 | Hsiung et al. | 324/755 |
| 2002/0008132 A1 * | 1/2002 | Minamitani et al. | 228/110.1 |
| 2002/0192936 A1 * | 12/2002 | Ball | 438/613 |
| 2003/0203660 A1 * | 10/2003 | Kassa et al. | 439/65 |
| 2003/0205607 A1 * | 11/2003 | Minamitani et al. | 228/1.1 |
| 2003/0213832 A1 * | 11/2003 | Kang et al. | 228/180.22 |
| 2004/0089697 A1 * | 5/2004 | Isa | 228/41 |
| 2005/0035182 A1 * | 2/2005 | Mano et al. | 228/180.22 |
| 2005/0098610 A1 * | 5/2005 | Onobori et al. | 228/180.21 |
| 2005/0122126 A1 * | 6/2005 | Ferland et al. | 324/761 |

* cited by examiner

*Primary Examiner*—Hung V. Ngo
(74) *Attorney, Agent, or Firm*—John A. Jordan; William H. Steinberg

(57) ABSTRACT

An electronic package includes a substrate having a contact pad thereon, a reformable member such as a solder ball positioned on the contact pad, and an elastic member positioned around the reformable member. The elastic member exerts a girdling force on the reformable member so that when the reformable member is softened, the elastic member elongates the reformable member. This elongation accommodates thermal and other stresses between the foregoing substrate and another substrate joined at the free end of the reformable member. An apparatus is also provided for positioning the elastic member on and around the reformable member.

26 Claims, 22 Drawing Sheets

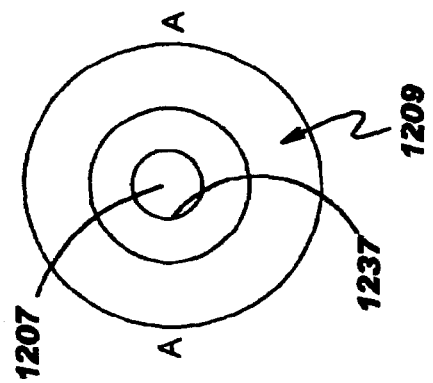
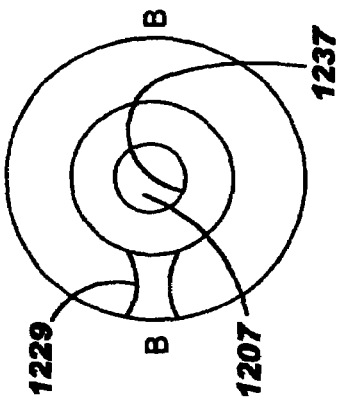
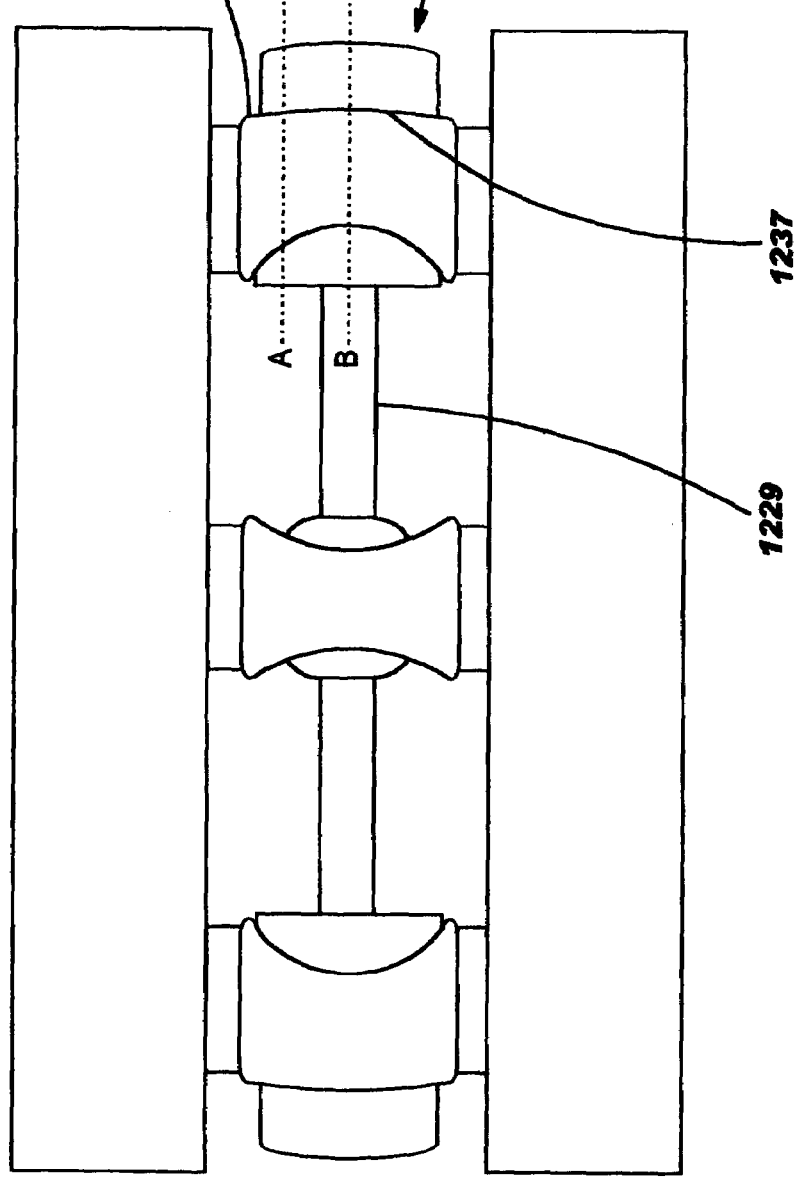

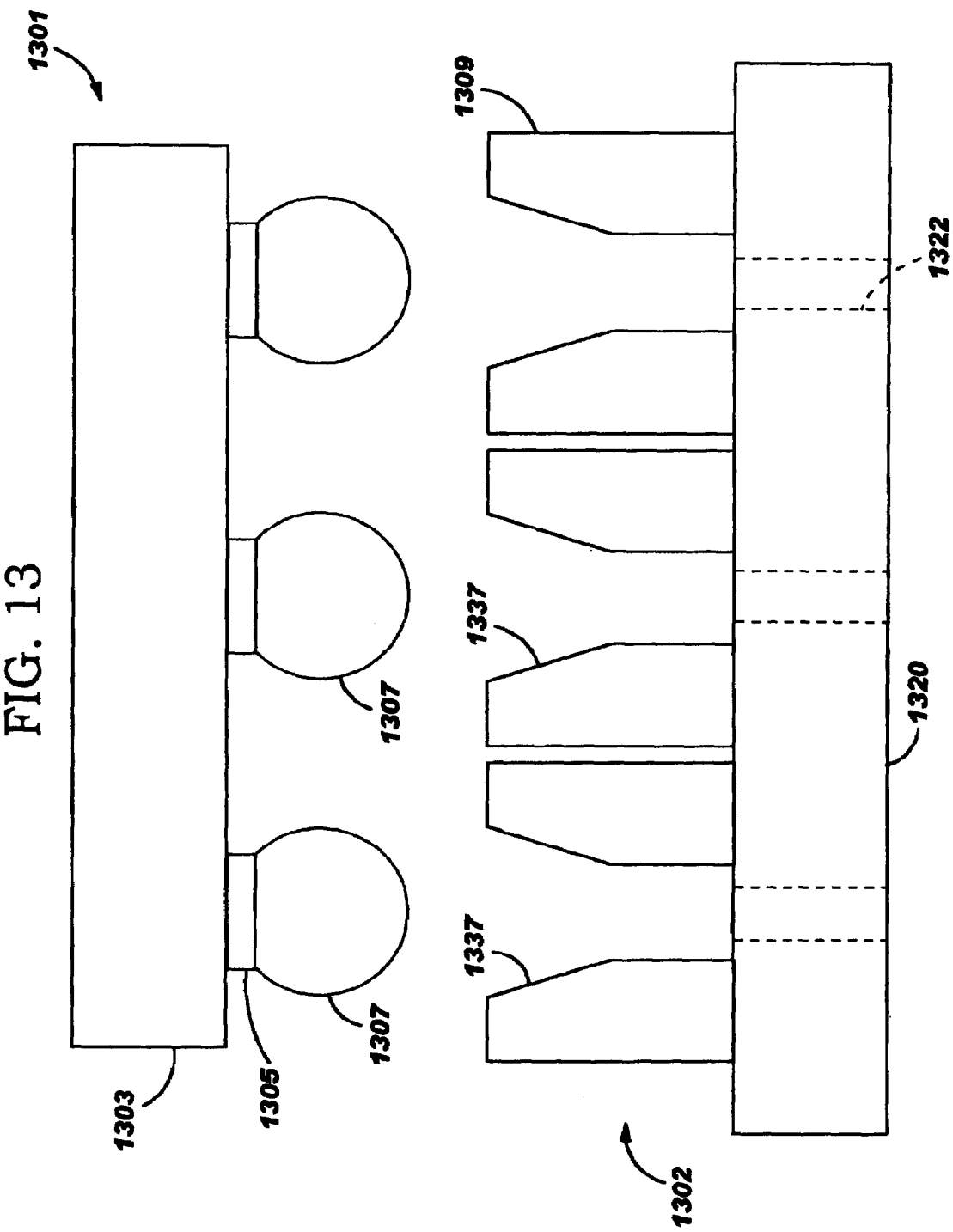

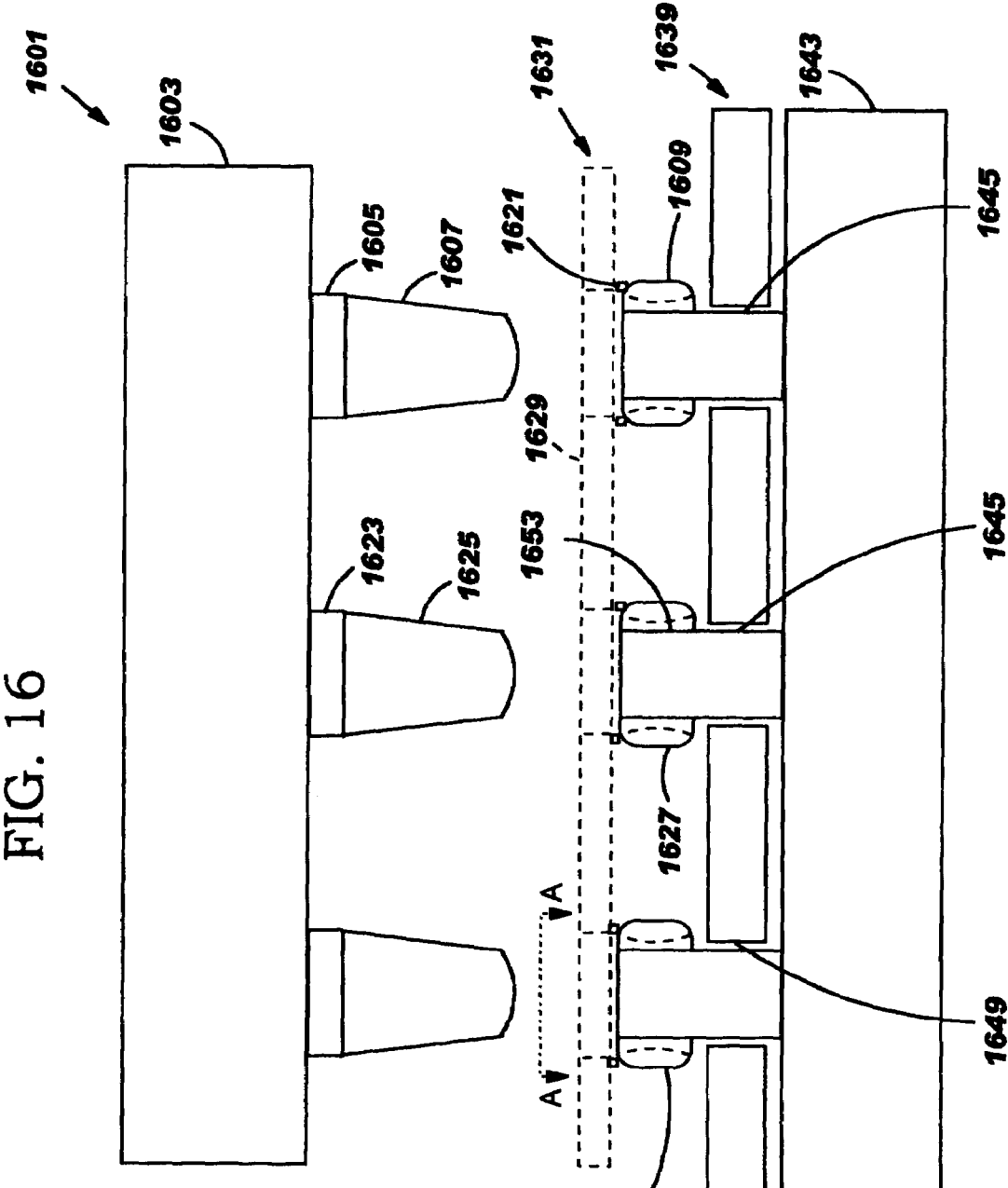
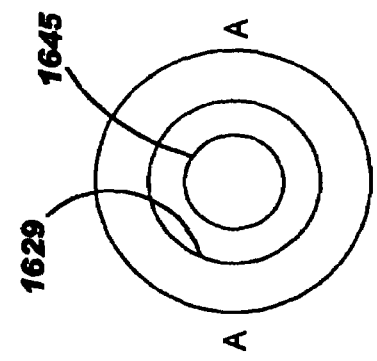
FIG. 16
FIG. 16A

METHOD OF REFORMING REFORMABLE MEMBERS OF AN ELECTRONIC PACKAGE AND THE RESULTANT ELECTRONIC PACKAGE

This application is a divisional application of parent application Ser. No. 09/300,783, filed Apr. 27, 1999, now U.S. Pat. No. 6,583,354 and allowed on Feb. 11, 2003.

FIELD OF THE INVENTION

The invention relates generally to electronic packages and more particularly to assemblies for connection of integrated circuit chips to chip carriers, chip carriers to printed circuit boards, modules to printed circuit cards, and the like.

BACKGROUND OF THE INVENTION

Various ceramic ball grid array packages, leadless chip carriers, laminated chip carriers, tape ball grid array packages, and overmolded, globtop, and plastic ball grid array packages are known today. Such packages typically contain a semiconductor device (a chip) and provide for electrical and thermal connection paths to and from the chip, while protecting the chip from extraneous environmental factors, processing chemicals, and handling.

Such packages typically include connections known in the art as solder reflow (or melt) connections. These connections provide for both electrical and thermal conduction paths. It is known from prior art that a reformable solder ball 107 can be attached to contact pad 105 on substrate 103 of electronic package 101, as depicted in FIG. 1. Further, as depicted in FIG. 2, it is known from prior art that solder ball 207 can be attached to contact pad 206 of substrate 204. Typically substrate 204 is circuitized. Solder ball 207 provides a standoff distance s between contact pads 205 and 206; this standoff provides mechanical compliance between the two substrates. It is also known that a higher standoff, with resulting increased compliance, can result in improved resistance to fatigue. The connections may be formed between a chip and a circuitized substrate, serving as a chip carrier package. Examples of circuitized substrates include printed wiring boards, flexible circuit cards, laminated chip carriers, metallized ceramic substrates, and multi-layer ceramic substrates. When a chip is connected to a circuitized substrate with numerous solder reflow connections, this form of connection is also known in the art as "flip-chip" or controlled collapse chip connection (C4), and results in a flip chip package.

Aside from flip chip packages, there are many kinds of chip carrier packages known in the art of semiconductor packaging. Other forms of chip carrier packages include wirebond chip carriers, thermo-compression bond chip carriers, and hybrid chip carrier devices. Further connection of a chip carrier package to a circuit card or board may be accomplished by utilizing known solder reflow methods to obtain what is commonly known as a ball grid array (BGA) connection therebetween. Various circuit cards, usually comprised of several layers of dielectric material, e.g., fiberglass-reinforced epoxy resin, interspersed with various conductor layers, (power, signal and/or ground planes) and often including plated through-holes and/or internal conductive vias, are known in the art.

An inherent problem with either the C4 or BGA connection is that the thermal expansion characteristics of the two objects being connected may differ substantially. For example, the linearized coefficient of thermal expansion (CTE) of silicon is in the 2.5 to 4.0 part per million/degree Celsius (ppm/C) range, while the CTE of a circuitized substrate may be 3 to 25 ppm/C, depending on the material choices. Therefore, the solder connections between a chip and circuitized substrate will be subject to thermally-induced stresses. This stress is generally increased by the use of larger, more complex, higher performance (i.e., more powerful and thermally dissipative) and higher signal count chips. Since many hundreds, and even thousands, of connections may be present in a single chip carrier package, the method of forming the connections must also be reliable, manufacturable, efficient, and economical. In a similar manner, thermal expansion mismatch between a chip carrier package and a circuit card or board may give rise to significant stresses which adversely affect reliability. (A typical printed circuit board composed of common glass-epoxy has a CTE value of 17 to 22 ppm/C, while a chip carrier has a composite CTE value which may vary from 3 ppm/C to 25 ppm/C, depending on geometry and material choices.)

To manage these problems, several strategies are known in the art. Two of these include the use of a stress-relieving underfill (or encapsulant), and the use of high-standoff solder joints including high-melt solder standoffs and solder-coated copper ball standoffs. The use of fatigue resistant solder materials, the use of conductive adhesives to form the C4 or BGA connections, and the use of compliant substrate materials are also known in the art. Each of these methods helps to form reliable connections, but at a cost of manufacturability, restrictive material choice, or other disadvantage. For example, the use of underfill as a stress-relieving method to protect the connections generally prevents subsequent removal and replacement to replace or repair a device (commonly known as rework). The use of a solder-coated copper ball as a standoff-enhancement device results in a higher standoff, but greatly increased joint stiffness. Known solder columns comprise preformed high-temperature solder material. The high-temperature material is required to keep its preformed shape during subsequent solder reflow attachment. The solder column is generally attached to a device with a second, lower-melting solder in conjunction with an alignment fixture. The manufacturability difficulties of the solder column connection method limit the pitch (distance between adjacent columns) of a package interconnection to about 1.0 millimeter (mm) at the present time, and require the use of a hierarchy of solder melt materials.

A method for dynamically forming a solder column instead of preforming the solder column, while retaining a column-like shape during temperature excursions beyond the solder melt temperature would be very desirable. Further, the ability to obtain shapes other than simple columns would be very desirable because the shape of the solder connection can influence the internal stresses, and the reliability of the connection and manufacturability.

OBJECTS AND SUMMARY OF THE INVENTION

An object of the present invention is to provide an electronic package having an improved standoff capability to provide improved package reliability.

Another object of the present invention is to provide a fixture for preparing the foregoing electronic package for assembly manufacturing.

Still another object of the present invention is to provide a method for preparing the foregoing electronic package for manufacturing.

According to one aspect of the present invention, an electronic package is provided comprising a substrate having a contact pad thereon, a reformable member positioned on the contact pad, and an elastic member positioned substantially around the reformable member.

According to another aspect of the present invention, there is provided an apparatus for positioning the elastic member, substantially around a reformable member with the reformable member positioned on a base. The apparatus comprises a first plate having a pin projecting into an opening of the elastic member and a second plate having an aperture therein and interposed between the first plate and the elastic member. The pin projects through the aperture in the second plate. The second plate is movably positioned with respect to the pin of the first plate for removing the elastic member from the pin and positioning the elastic member substantially around the reformable member such that the reformable member is located in the opening of the elastic member.

The invention is adaptable to mass production and will provide significant improvement in the ability to manufacture high reliability electronic packages, having a high standoff from the substrate to which the packages are assembled.

BRIEF DESCRIPTION OF THE DRAWINGS

FIG. 12 is a partial side sectional view, in elevation and on a much enlarged scale, of an electronic package in accordance with another embodiment of the present invention, depicting elastic sleeves substantially surrounding reformed c shaped solder slugs.

FIG. 13 is a partial side sectional view, in elevation and on a much enlarged scale, of an electronic package in accordance with another embodiment of the present invention, depicting an assembly of elastic sleeves for positioning over reformable solder balls.

FIG. 16 is a partial side sectional view, in elevation and on a much enlarged scale, of an electronic package in accordance with still another embodiment of the present invention, depicting the reformed solder slugs shown in FIG. 15 after removal of the elastic sleeves. Also shown is an apparatus for further positioning other elastic sleeves on the reformed solder slugs.

BEST MODE OF THE INVENTION

Figure 3:
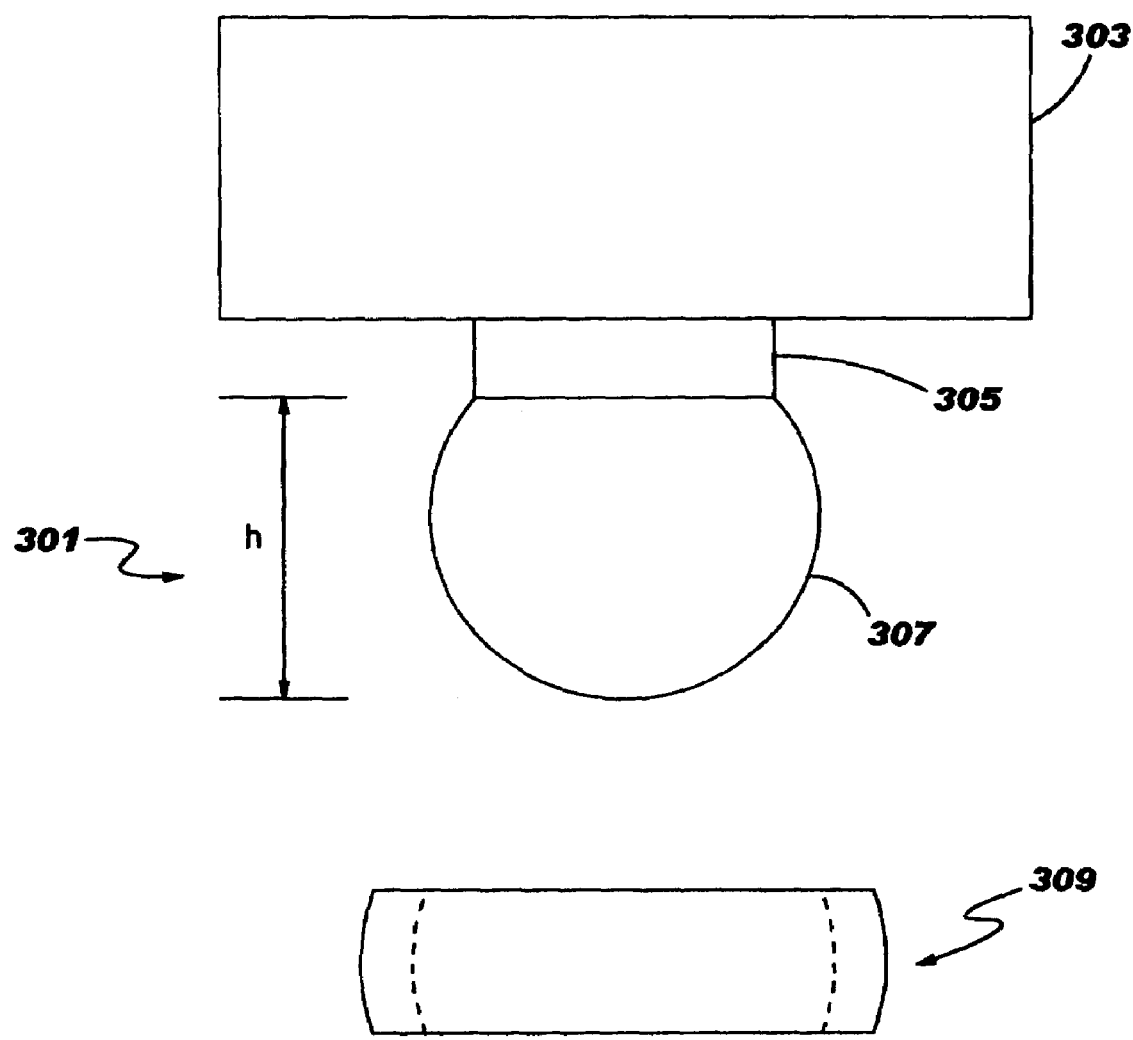
FIG. 3 is a partial side sectional view, in elevation and on a much enlarged scale, of an electronic package with a reformable solder ball positioned to receive an elastic sleeve in accordance with the present invention.
Figure 4:
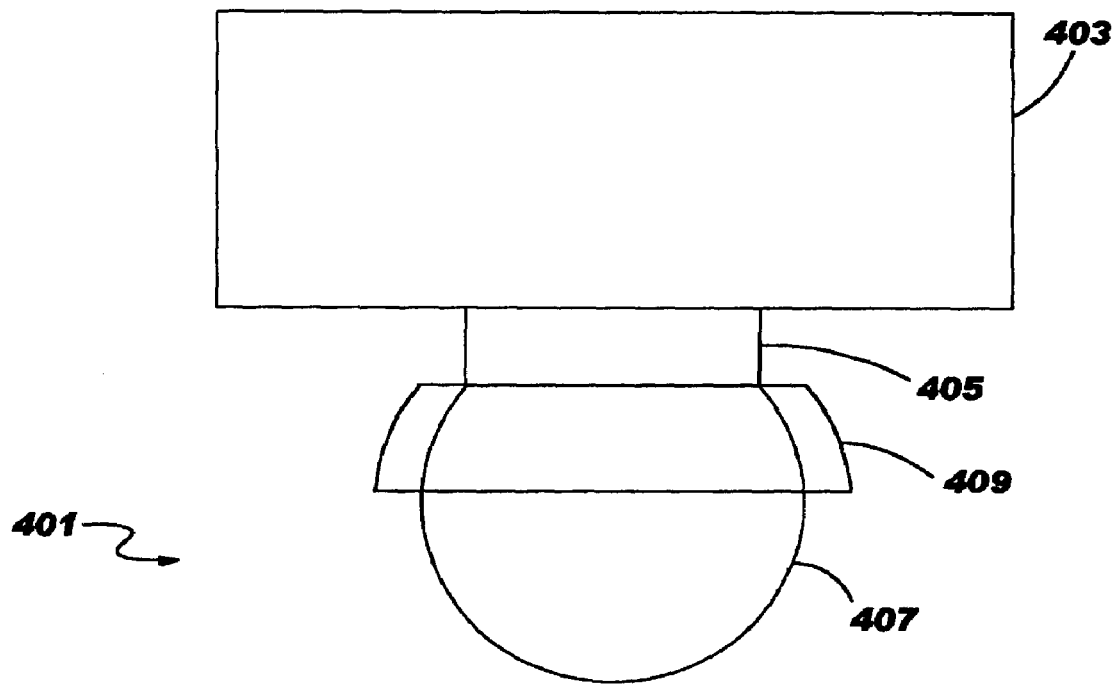
FIG. 4 is a partial side sectional view, in elevation and on a much enlarged scale, of the electronic package of FIG. 3 after the elastic sleeve has been positioned around the reformable solder ball.
Figure 5:
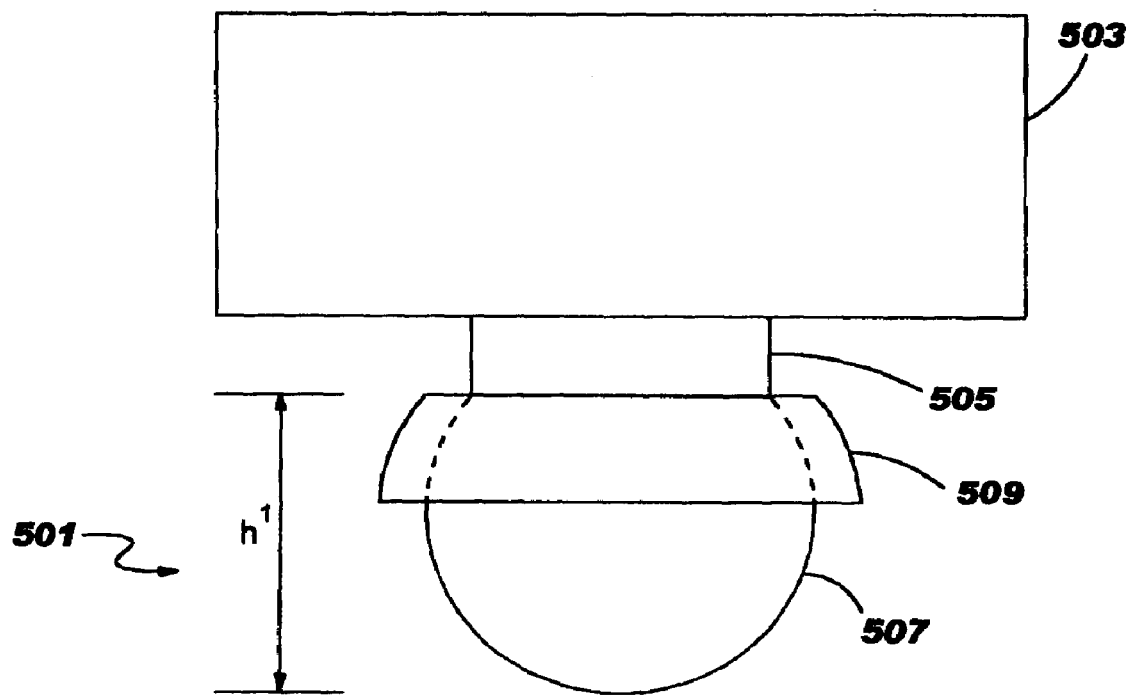
FIG. 5 is a partial side sectional view, in elevation and on a much enlarged scale, of the electronic package of FIG. 4, depicting the elastic member positioned around a reformed solder slug.

Referring now to the drawings in detail, FIGS. 3–5 illustrate a process for making an electronic package according to one embodiment of the present invention. The electronic package 301 comprises a substrate 303, a contact pad 305, and a reformable ball 307. By way of example, reformable ball 307 is a solder ball. An elastic sleeve 309 is formed from rubber, plastic or a shaped memory alloy and is initially apart from electronic package 301. When relaxed, an inner diameter (shown in phantom) of elastic sleeve 309 is less than an outer diameter of reformable solder ball 307. In FIG. 4, elastic sleeve 309 has been positioned around reformable solder ball 307 by stretching the elastic sleeve from its relaxed state to an unrelaxed state conforming to the outside diameter of the reformable solder ball 307. To ease application of the elastic sleeve, a lubricant such as a solder flux may be employed. A girdling (or squeezing) pressure now exists between elastic sleeve 309 and reformable solder ball 307, while ball 307 is in a solid condition. By heating reformable solder ball 307 to its softening temperature, the solder ball responds to the girdling pressure exerted by elastic sleeve 309. Consequently, reformable solder ball 307 takes a new elongated shape depicted in FIG. 5 as reformed, nipple-shaped solder 507, which shape is predetermined and held by now-relieved elastic sleeve 309. After reshaping, the stiffness of the reformed solder 507 may be increased by reducing temperature. In particular, an increased standoff distance h' between contact pad 305 and the tip of reformed solder 507 is evident (as compared to distance h in FIG. 3).

The method for making and utilizing an elongated reformed slug may be varied somewhat depending on the materials chosen, so several examples will be given to illustrate how to best implement the present invention.

Softening of many materials such as plastics, epoxies, metals, and organic materials is known to occur at increased temperature. With some materials, such as solder, a phase change from solid to a melt or molten state of the material can be achieved at a sufficient temperature. The molten state exhibits essentially a zero shear modulus. Eutectic tin-lead solder, for example, has a melting phase transition point of about 183° C. (Centigrade). Higher melting point solders can be obtained with various ratios of tin and lead: about 3% tin and about 97% lead is a common high-melt (about 310° C.) alloy.

Numerous plastics exhibit a phase transition from hard, glass-like behavior to relatively soft, visco-elastic behavior at a temperature, known as the glass transition temperature, in the range of about −70° C. to about 170° C. and have a corresponding, approximately ten times decrease in stiffness through that transition. These materials when filled with conductive particles can be used as reformable balls or slugs in conjunction with appropriate choices of materials for elastic members. For example, epoxy resins, which can have electrically conductive filler particles such as silver mixed in with the resin can have glass transition temperatures below about 100° C.

Figure 6:
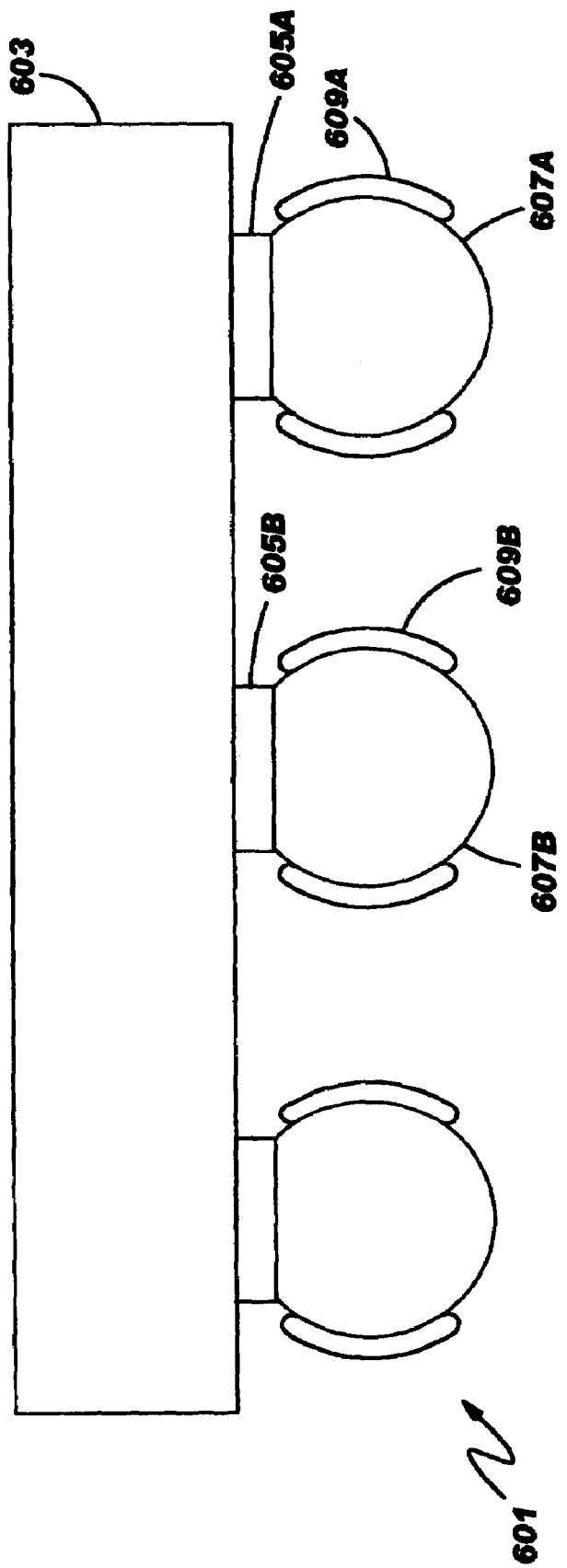
FIG. 6 is a partial side sectional view, in elevation and on a much enlarged scale, of an electronic package in accordance with another embodiment of the present invention, depicting elastic sleeves substantially surrounding reformable solder balls positioned near a circuitized substrate.
Figure 7:
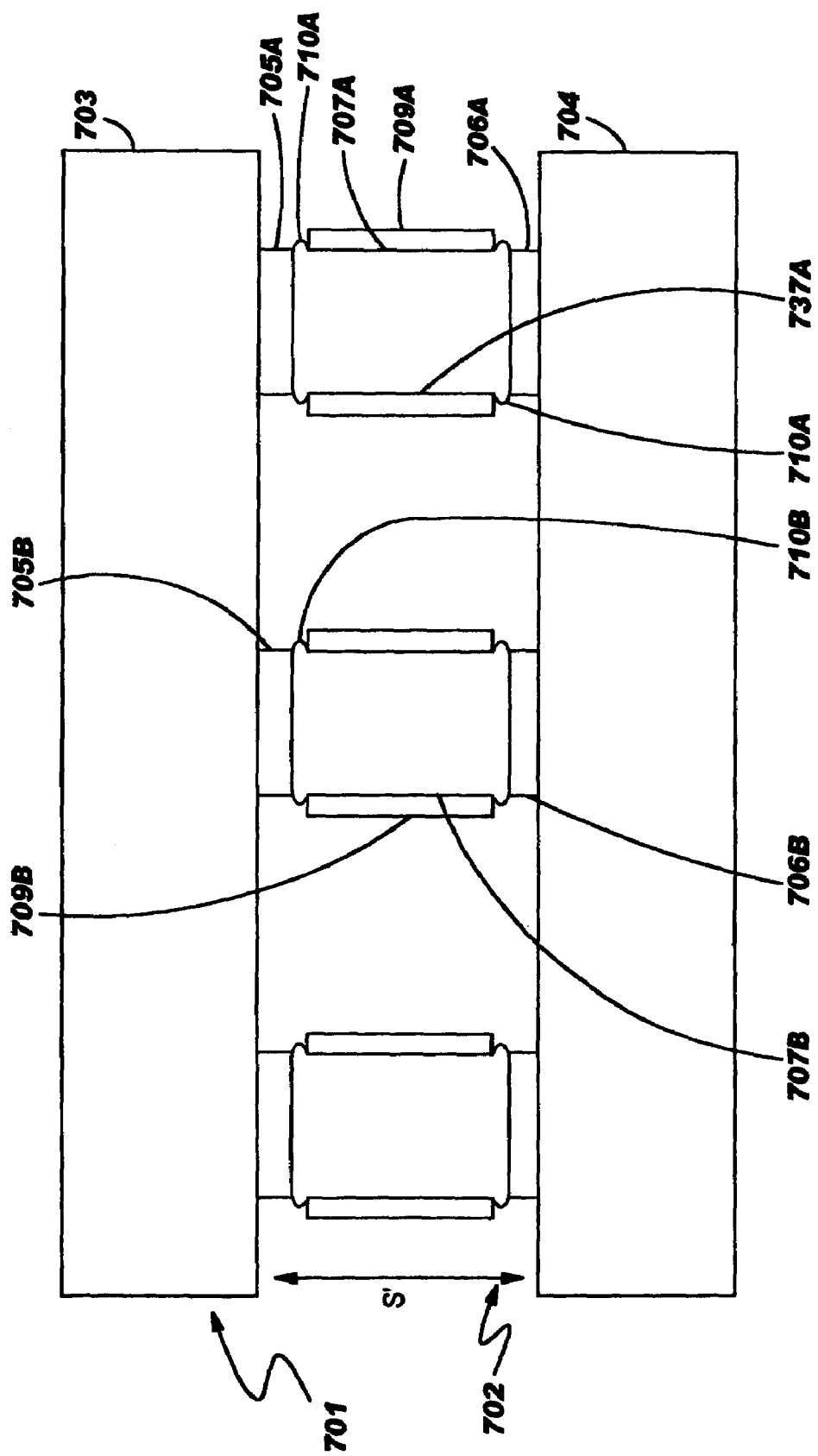
FIG. 7 is a partial side sectional view, in elevation and on a much enlarge scale, of the electronic package of FIG. 6 after heating and in contact with the circuitized substrate after heating and contact.

The method of making electronic package 701 with a high standoff reformed slug 707A illustrated in FIG. 7 will now be described. FIG. 6 illustrates an elastic sleeve 609A which has been stretched onto and around reformable ball 607A prior to any heat being applied. The final shape and diameter of the opening 737A (FIG. 7) of the elastic sleeve 609A on reformed slug 707A are carefully chosen and predetermined in conjunction with both the quantity of material in the reformable ball 607A and the contact pad 605A geometry, so as to obtain a desirable final shape of reformed slug 707A. For example, for a circular contact pad with diameter of about 24 mils (thousandths of an inch), and a eutectic solder volume of 10000 cubic mils of solder, the cylindrical sleeve would have an interior diameter of about 22 to 23 mils, with a height of about 10–15 mils, and a wall thickness of about 2 to 4 mils. For this configuration, the maximum initial diameter of the reformable ball 607A is about 28 mils, so that the elastic sleeve 609A is circumferentially stretched to be positioned around reformable ball 607A, applying pressure onto the reformable ball. When the reformable ball is comprised of eutectic solder, before the heat is applied, the pressure of the elastic sleeve 609A has negligible effect on the shape of reformable solder ball 607A. An excellent and common material choice for reformed slug 707A is eutectic solder because it is both electrically and thermally conductive, has a relatively low melting point of about 183° C., has a high surface tension and easily wets to and connects to metallic contact pads 705A and 706A. In order to provide the high standoff of reformed slug 707A with a minimum quantity of solder and small contact pad dimensions, elastic sleeve 609A should be shaped as a hollow cylinder and comprise low durometer (less than about 70 Shore A) silicone rubber. Silicone rubber is resistant to high temperature (up to about 300° C. or more for short period of time, e.g., less than several minutes) without degradation. It also has desirable stiffness properties, because it is relatively soft (a modulus of a few hundred psi) compared to eutectic solder in solid phase (a modulus of about a million psi, depending on temperature) but is stiff compared to molten solder (with nearly a zero modulus, as it is a fluid). Other materials for the reformable slugs and elastic sleeves may be used as well. For example, soft plastic which shrinks upon heating may readily be obtained in the form of a cylindrical sleeve, and utilized to apply girdling pressure to a reformable slug in the form of a silver-filled conductive epoxy adhesive.

Figure 1:
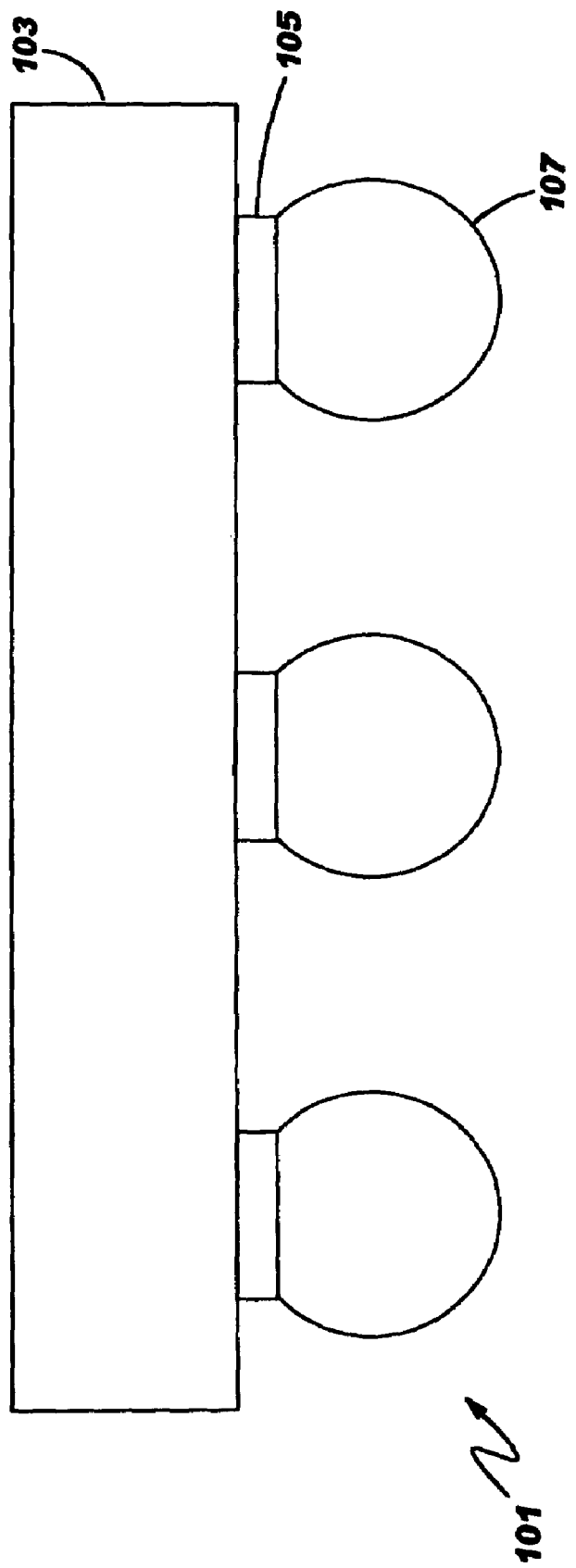
FIG. 1 is a partial side sectional view, in elevation and on a much enlarged scale, of an electronic package in accordance with prior art.
Figure 2:
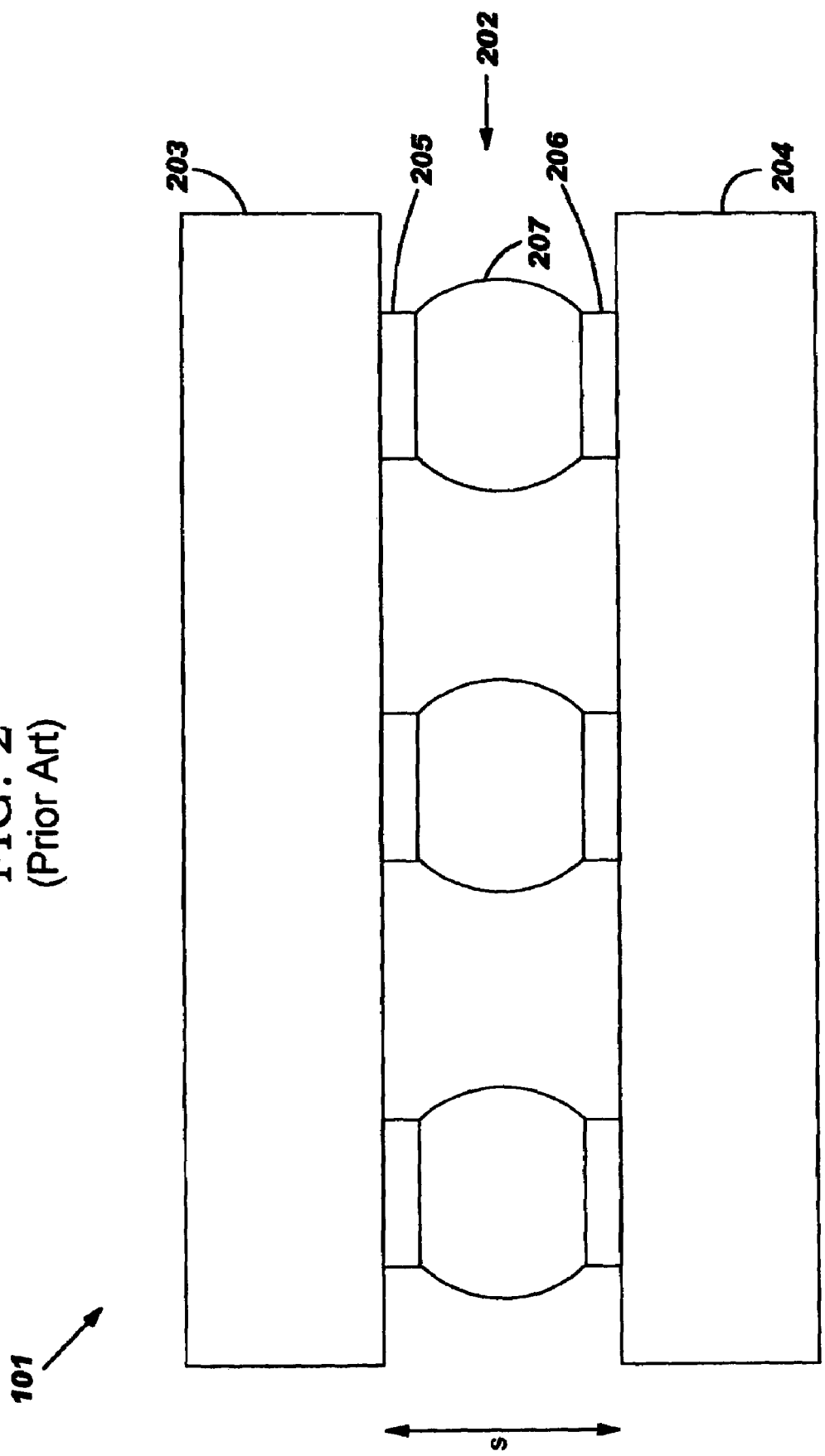
FIG. 2 is a partial side sectional view, in elevation and on a much enlarged scale, of the electronic package of FIG. 1 connected to a circuitized substrate in accordance with the prior art.

Reformable solder ball 607A with elastic sleeve 609A is positioned near another substrate 604 having contact pad 606A, and the temperature of the reformable solder ball 607A is increased to melt the reformable solder ball. The melting of the solder allows wetting of reformable solder ball 607A to the second contact pad 706A. The melting reduces the reformable solder ball 607A material stiffness sufficiently so that the pressure exerted by elastic sleeve 609A is sufficient to now force a changed shape, a cylinder depicted in FIG. 7 with opening 737A. The girdling pressure exerted by elastic sleeve 609A easily overcomes surface tension, and forces what would have been a truncated ball-like shape (as depicted in FIG. 2 of reformable ball 107) into a more upright cylindrical shape 707A. For the same quantity of solder and pad dimensions, a higher standoff height (s'>s) will result. The predetermined shape of the opening 737A of elastic sleeve 709A, as that of a cylinder, will nearly be replicated onto the molten reformed solder slug, as the resistance of the surface tension with respect to the material stiffness of the silicon rubber of elastic sleeve 709A is very small. Portions 710A of the surface of reformable slug 707A which are not in contact with the elastic sleeve 709A will take a rounded shape as dictated by surface tension. The transformation of shape occurs very quickly (on the order of seconds upon melting of the solder) and upon cooling, the transformed shapes are maintained. The elastic sleeve 709A may be left in place, because the stiffness of the rubber comprising the elastic sleeve is small compared with solidified eutectic solder and no significant stress concentrations or detriments due to its presence will result. However, there is a very significant fatigue life improvement realized for reformed slug 707A due to the increased standoff, s', of the connection 702. Even though the example presented here has described one attachment between substrates 603 and 604, it can be easily shown that multiple attachments can be formed as shown in FIGS. 6 and 7. For example, elastic sleeve 609B acts to yield another elongated reformed slug 707B which is positioned on contact pad 705B of electronic component 701 and contact pad 706B on substrate 704. When there are multiple attachments on the electronic package, the present invention also reduces the tendency of reformable slug 707A to accidentally contact and 'bridge' to another reformable slug 707B to form an undesirable short circuit.

Figure 8:
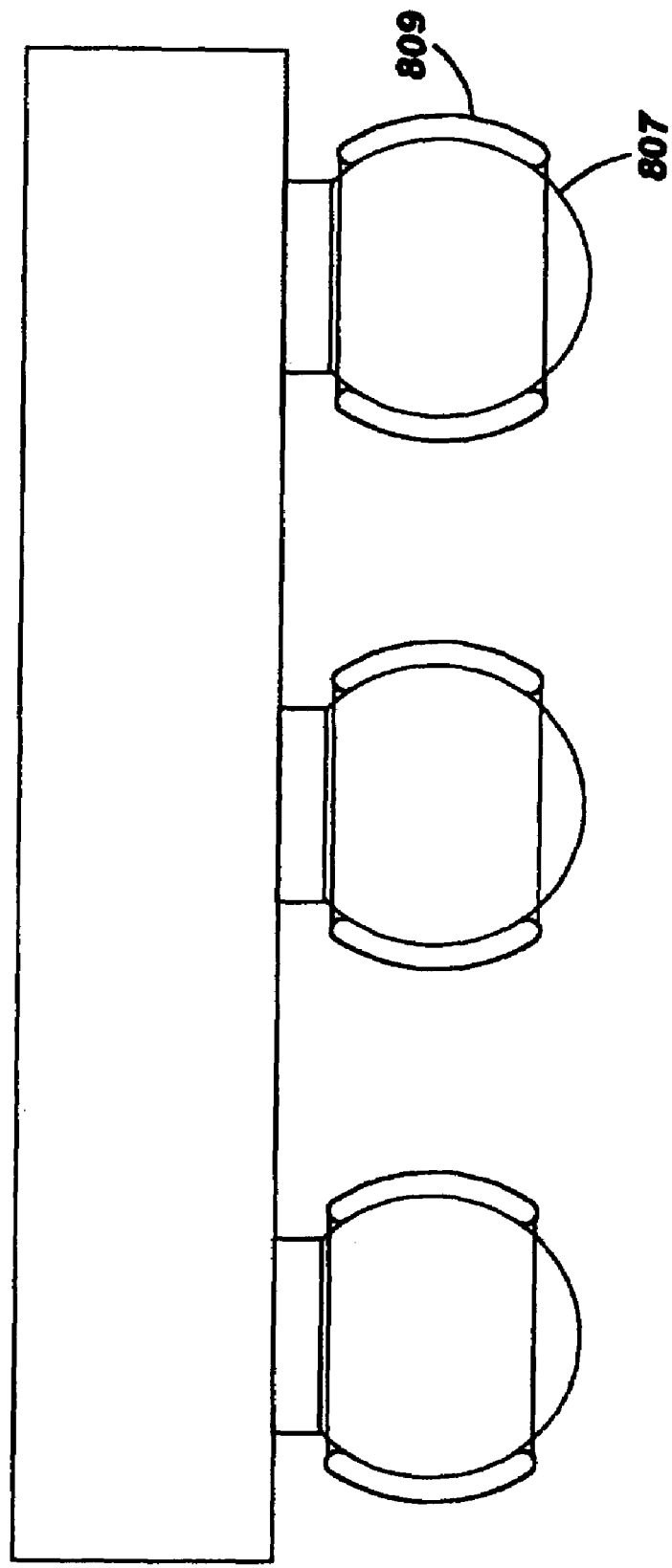
FIG. 8 is a partial side sectional view, in elevation and on a much enlarged scales of an electronic package in accordance with yet another embodiment of the present invention, depicting elastic sleeves substantially surrounding reformable solder balls.
Figure 9:
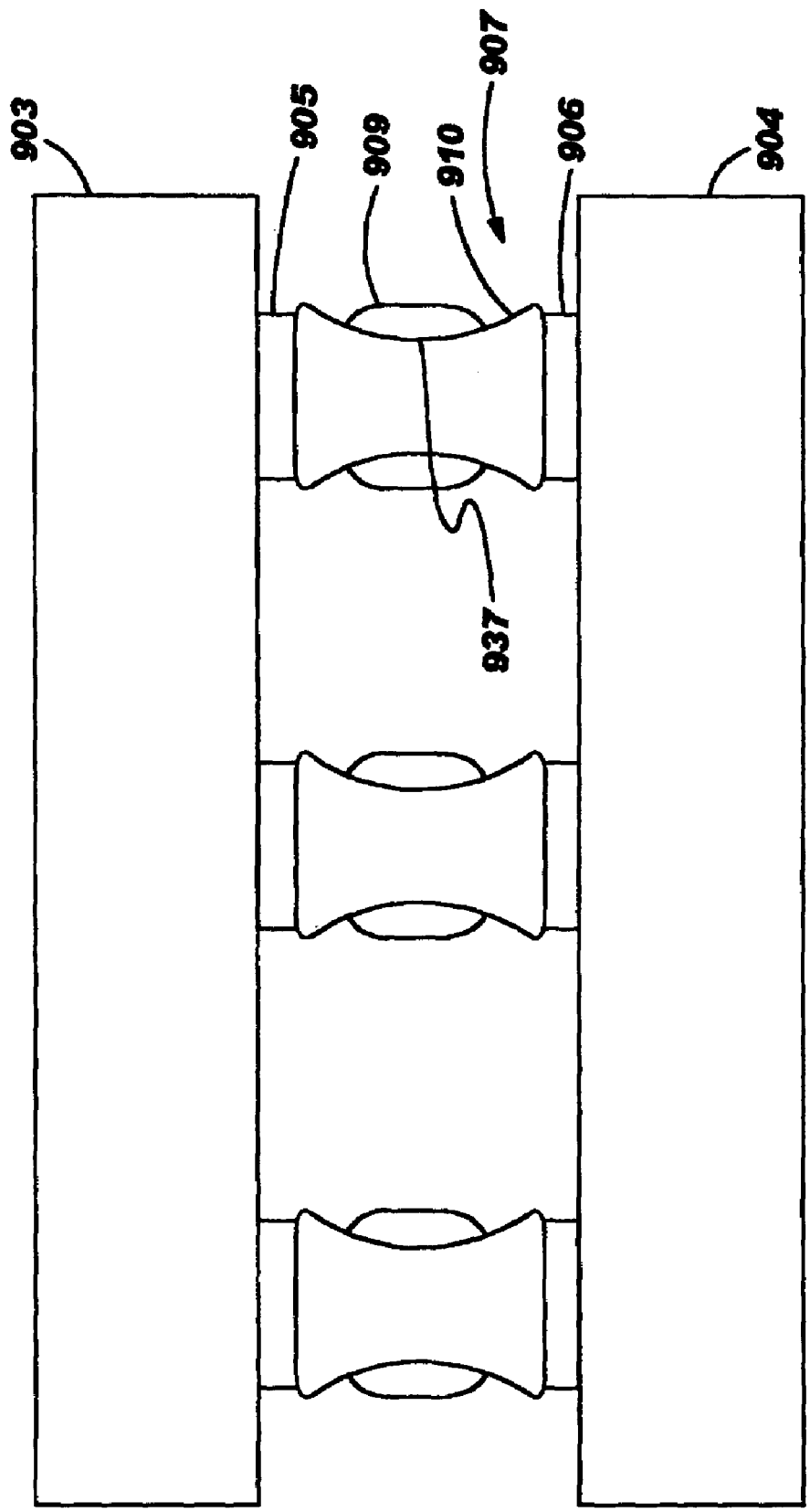
FIG. 9 is a partial side sectional view, in elevation and on a much enlarged scale, of an electronic package in accordance with still another embodiment of the present invention depicting reformed solder slugs in a substantially hourglass shape.

FIG. 9 illustrates another reformed solder slug 907 formed substantially in the shape of an hourglass in accordance with another embodiment of the present invention. FIG. 8 illustrates the manner of formation. An elastic donut-shaped sleeve 809 is stretched around reformable ball 807 which is attached to a contact pad 805 of a substrate 803. Reformable ball 807 is initially in a solid form. Sleeve 809 provides a girdling pressure of approximately several pounds per square inch on the solder ball when the solder ball is in this solid, spherical form. The girdling pressure is not large, but is sufficient to reform the softened solder ball. Then, solder ball 807 is heated to its softening temperature and the elastic sleeve relaxes, forcing solder material outward from the interior of the sleeve. Portions 910 of reformed solder slug 907 which are not in contact with elastic sleeve 909 take a smoothed bulging shape.

Figure 10:
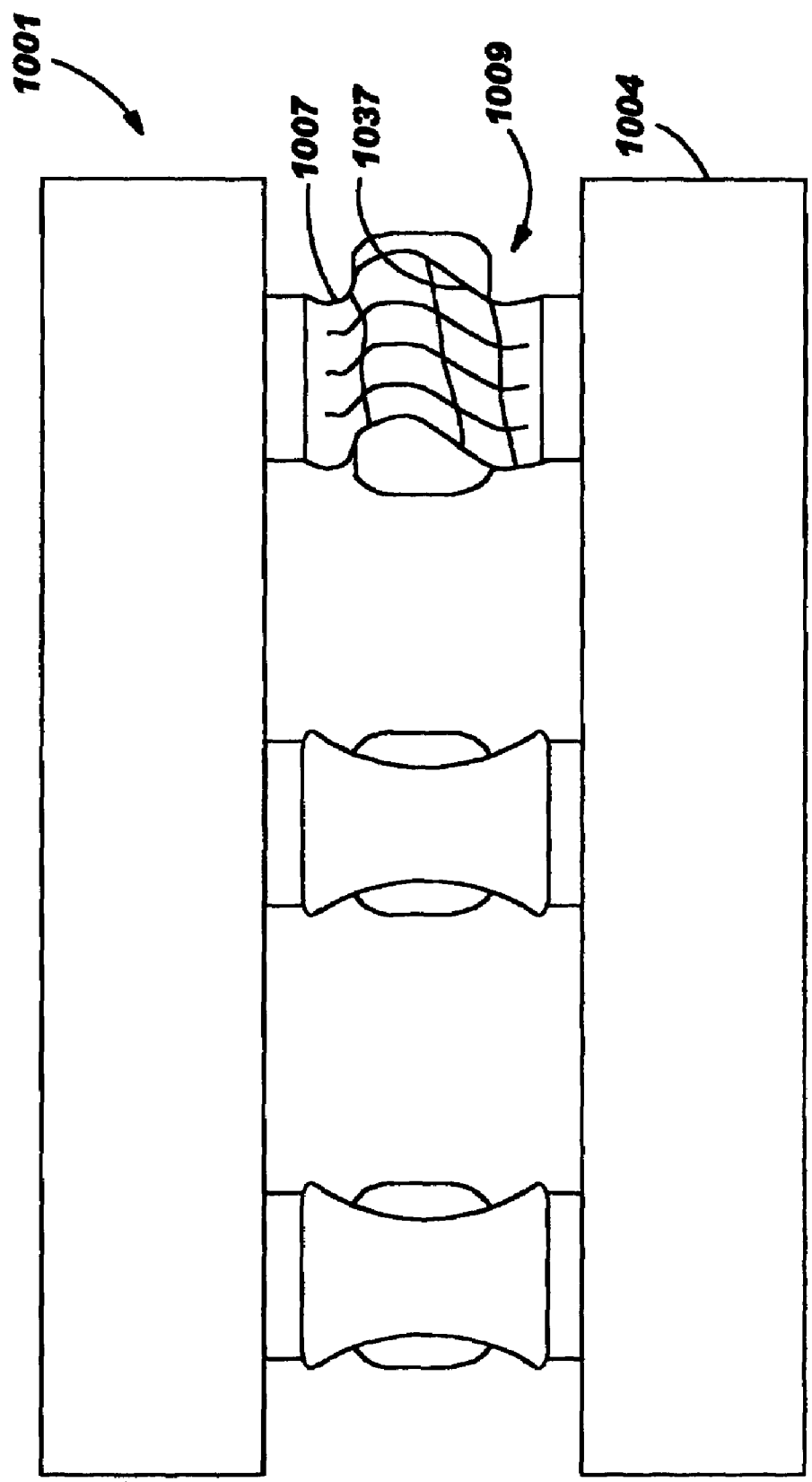
FIG. 10 is a partial side sectional view, in elevation and on a much enlarged scale, of an electronic package in accordance with another embodiment of the present invention, depicting elastic sleeves substantially surrounding reformable solder columns.

The present invention allows electronic package designers to have many shape options available to optimize reliability of various electronic packages. Utilizing other shapes of openings of elastic sleeves to further tailor the resulting shape of the reformable ball or slug makes this possible. The elasticity of silicon rubber, approaching several hundred percent strain allows an elastic sleeve to be molded into a variety of complex and intricate shapes, even with substantially undercut features. In FIG. 10, an example is depicted of an opening 1037 of elastic sleeve 1009 which has been used to form reformed slug 1007 into a shape resembling a helix. FIG. 10 illustrates three different cross sections of the sleeve 1009. Other shapes are possible, for example, a C-shaped reformable slug 1209 is depicted in FIG. 12. S-shaped, and even coil-shaped reformable slugs and many other useful shapes can be obtained with complementary elastic sleeve shapes.

A complex ball grid array electronic package may require several hundred or even several thousand successful electrical connections, but in some devices, e.g., ceramic substrate electronic packages, not all of the connection members are highly stressed during operation. Typically several dozen of the connections near the far corners are highly stressed, while the interior connections are not. The stress tolerant slugs of the present invention can be used on the highly stressed corner connections to relieve radially oriented shear stresses which result from thermal expansion mismatches in the electronic package. Shear and bending stresses within the connection member are driven by the radially oriented thermal expansion mismatches. Since shear and bending stresses within the connection member increase with member section thickness, it is clearly beneficial to reduce member section thickness. Member section thickness is defined as the diameter of a round connection member. However, it is only necessary to reduce member section thickness in one direction; that is, with respect to the radially oriented direction. A rectangularly or eliptically-sectioned hourglass shaped connection, with the thinnest bending axis (minor axis) oriented radially from the electrical package central point, substantially reduces shear stress for those connections. This configuration allows the connection member to have reduced stresses while retaining the greatest possible cross sectional area, so as to have the greatest possible tensile strength. The interior solder slugs do not need elastic sleeves surrounding them, because these solder slugs, when reformed will have increased standoff from standoff caused by the several dozen corner connections which have the elastic sleeves. In other words, not all of the package connections need to have an elastic sleeve on them to achieve the benefits of the present invention. Application of the elastic sleeves to a sufficient number of reformable slugs to overcome surface tension of all the slugs will create increased standoff for all. It is also possible to use the elastic sleeves to simply enhance standoff and not for electrical or thermal connection, by strategically placing reformable balls or slugs to uniformly "lift" the substrate.

Figure 11:
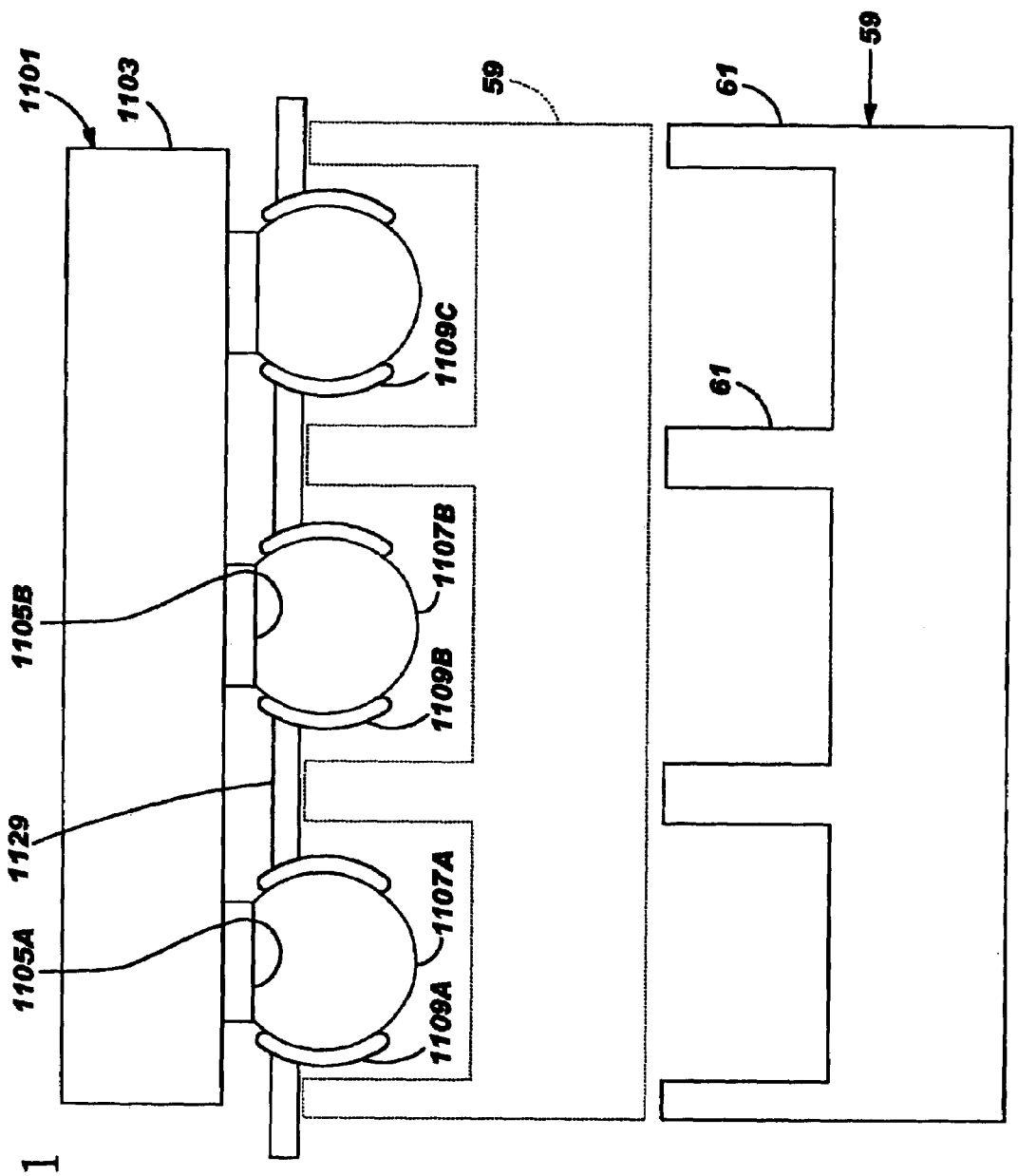
FIG. 11 is a partial side sectional view, in elevation and on a much enlarged scale, of an electronic package in accordance with another embodiment of the present invention, depicting elastic sleeves substantially surrounding reformable solder balls.

Composite molding many elastic sleeves together with an internal alignment web as one part is most convenient and efficient to quickly and simply position thousands of elastic sleeves in one operation. In FIG. 11, an elastic sleeve 1109A is positioned around reformable ball 107A on contact pad 1105A on substrate 1103. Another elastic sleeve 1109B is shown similarly positioned around another reformable ball 1107B which is on another contact pad 1105B on substrate 1103 of electronic package 1101. The elastic sleeves 1109A,B are connected together by web portion 1129, which aligns the sleeves with the reformable balls on substrate 1103. Positioning tool 59 (shown in two positions) with projections 61 has been used to press and position elastic members 1109A,B and other elastic sleeves 1109C, etc. onto and around reformable balls 1107A,B etc. Since the elastic sleeve openings are molded in predetermined locations so as to align to and correspond to selected ones of reformable balls, it is a simple and expedient matter to press the composite mold into place.

Figure 14:
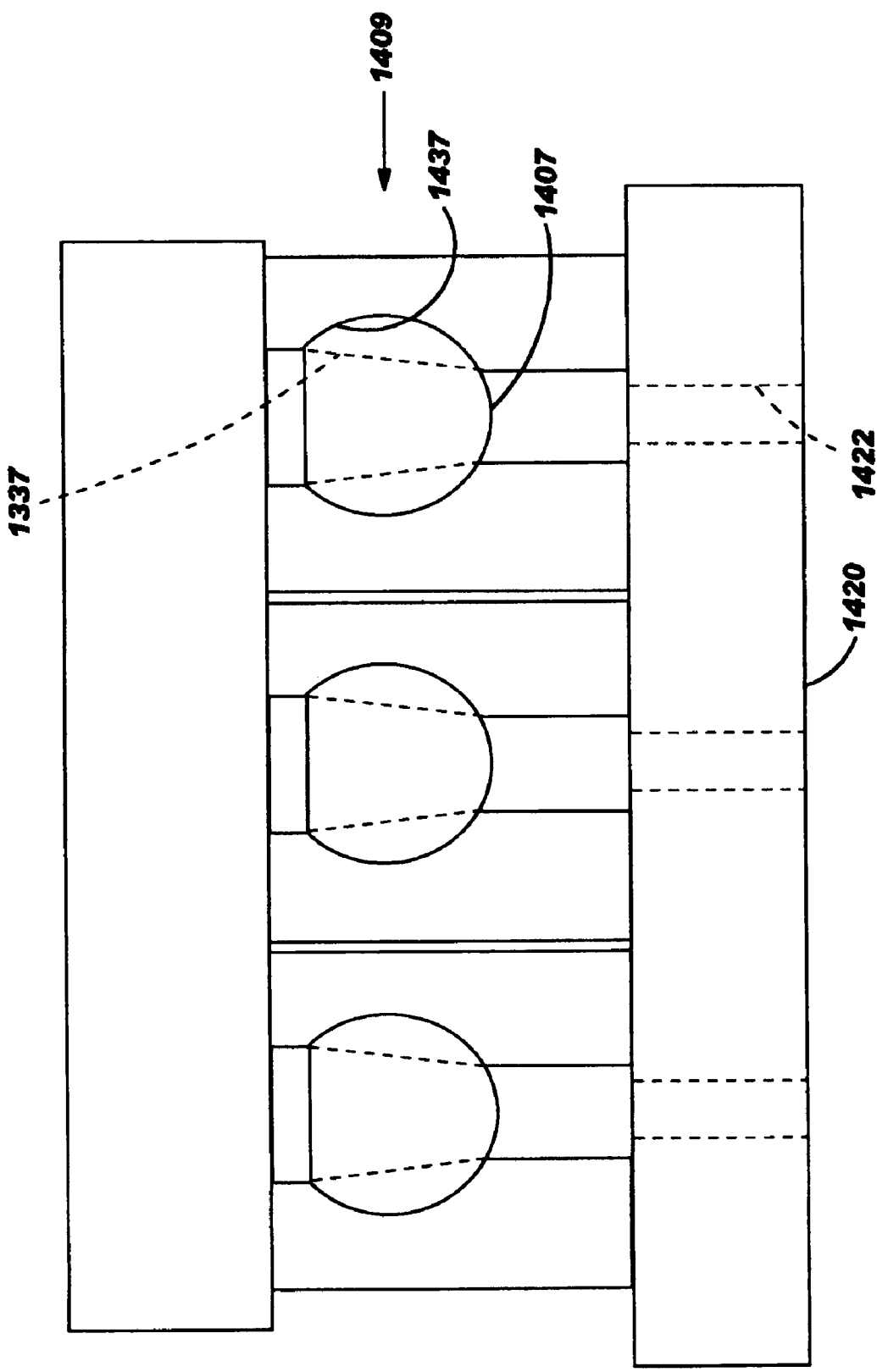
FIG. 14 is a partial side sectional view, in elevation and on a much enlarged scale, of an electronic package in accordance with another embodiment of the present invention, depicting the assembly of elastic sleeves shown in FIG. 13 positioned over and around the reformable solder balls.
Figure 15:
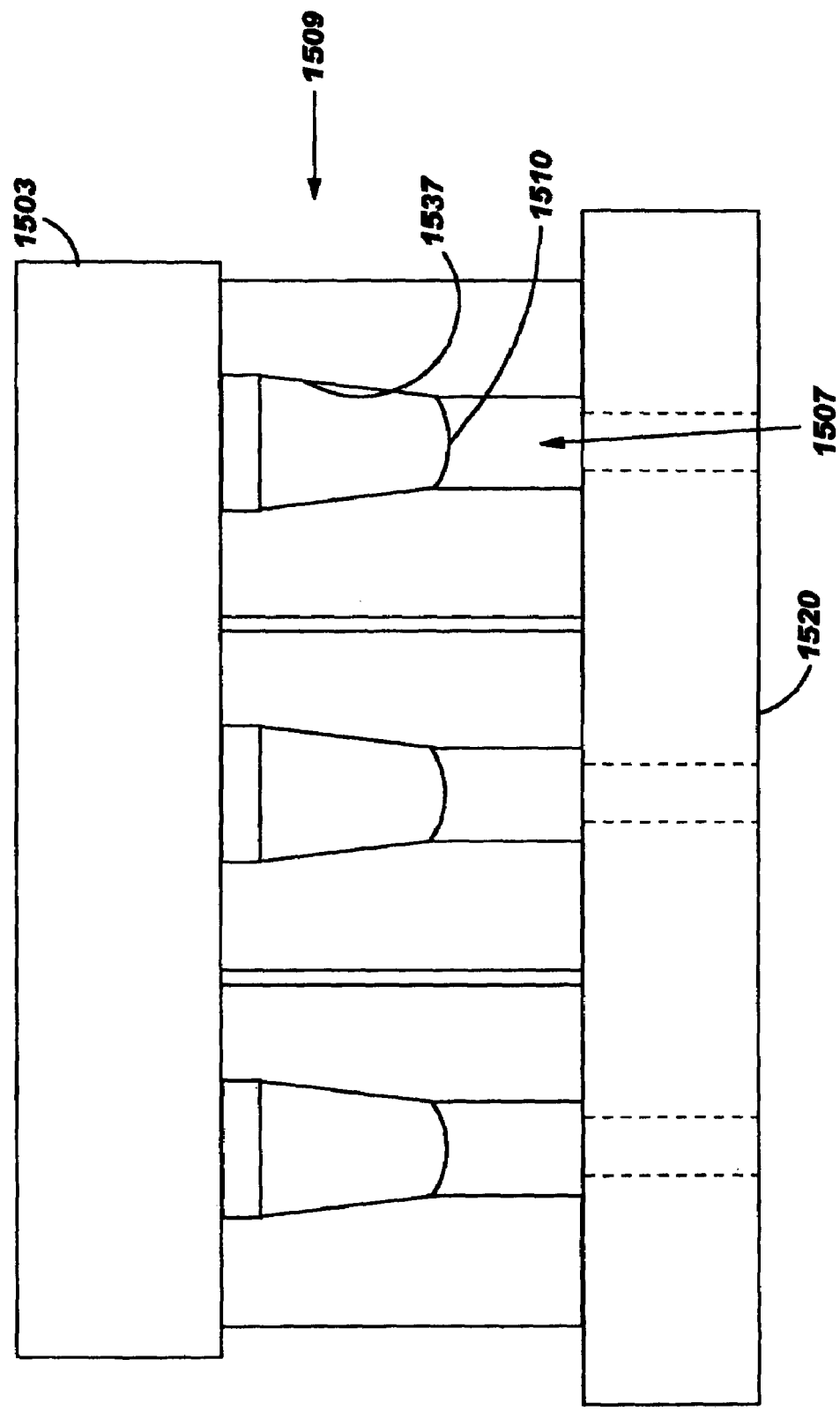
FIG. 15 is a partial side sectional view, in elevation and on a much enlarged scale, of an electronic package in accordance with another embodiment of the present invention, depicting the assembly of elastic sleeves of FIG. 13 positioned around reformable solder balls with reformable solder balls being shaped by elastic sleeves to form reformed solder slugs.

FIGS. 13 through 15 illustrate another embodiment of the present invention, an assembly 1302 of elastic sleeves 1309 and base plate 1320 for positioning the sleeves over reformable balls 1307. A portion of assembly 1302 can be positioned onto and around reformable balls 1307. Openings 1337 of the sleeves are aligned with reformable balls 1307 on contact pads 1305 on substrate 1303 of electronic package 1301. It is possible to have variously shaped and oriented openings 1337 in the sleeves, so that the shapes of reformable slugs on the electronic package are optimized for the best reliability of the electronic package attachment. One material that can be used for the sleeves is silicon rubber. The base plate 1320 secures the sleeves in place and can be comprised of a metal, preferably copper. Base plate 1320 includes pressure relief openings 1322 depicted as holes through the base plate 1320 to each opening 1337.

In FIG. 14, the openings 1337 (shown in phantom) of the sleeves of assembly 1309 are now positioned around respective reformable balls 1307, with opening 1337 now stretched to larger opening 1437, prior to softening of reformable balls 1307. In FIG. 15, reformed slug 1507 is formed by softening of reformable ball 1307 so as to yield to girdling pressure exerted by elastic sleeves 1337. Opening shape 1537 is forced upon reformed slug 1507. Portions 1510 of the elastic sleeves, not in contact with elastic sleeve, take a rounded shape as dictated by the surface tension of the softened material of reformed slug 1507. This configuration is held until reformed slug 1507 is re-hardened, preferably by cooling. In FIG. 16, the resulting electronic package 1601 is depicted with the reformed slug 1507 after assembly 1309 is removed.

Apparatus 1639 can provide for alignment and easy positioning of elastic sleeves 1609. This apparatus includes a rigid first plate 1643 which aligns and holds a number of pins 1645. These pins are positioned to corresponded to positions of respective reformed slugs 1507 which are positioned on contact pads 1305 on substrate 1303 of an electronic package 1601. The elastic sleeves 1609 are loaded onto the pins, which then provide alignment and guidance, and are pressed onto and around corresponding reformed slugs. A connector web or sheet 1629, depicted in phantom, is sheared off at tearaway tabs 1621, leaving separated elastic sleeves 1609 on the pins. Plate 1639 is used to push and dispense the elastic sleeves 1609. A second plate 1639 has apertures 1649 through which the pins 1645 extend, and is moveable so that second plate 1639 can force the elastic sleeves 1609 out and around the reformed slugs. The second plate 1639 is removed after the elastic sleeves are in position. Each of pins 1645 can be coated with a region 1653 of low-friction material, preferably Teflon (Teflon is a registered trademark of E.I. Dupont de Nemours and Co.) but alternately solder flux, plastic, or other low friction material can be used. Numerous elastic sleeves can be molded together as a one-piece part, with connector 1629 providing alignment between one another. When a reformable slug is shaped as a tapered cone, as reformed slug 1507, there will be little stretching, and little stress in the elastic sleeve. Upon temperature induced melting, the solder slug will assume the same final shape of the reformed slug 907 shown in FIG. 9. It is important that the reformable slug wet to the contact pad 906 before the elastic sleeve releases any stored stress, otherwise undesirable geometries may occur. A quantity of lower-melting solder paste or other adhesive may be used to provide sufficient wetting contact at the contact pad 906.

Figure 17:
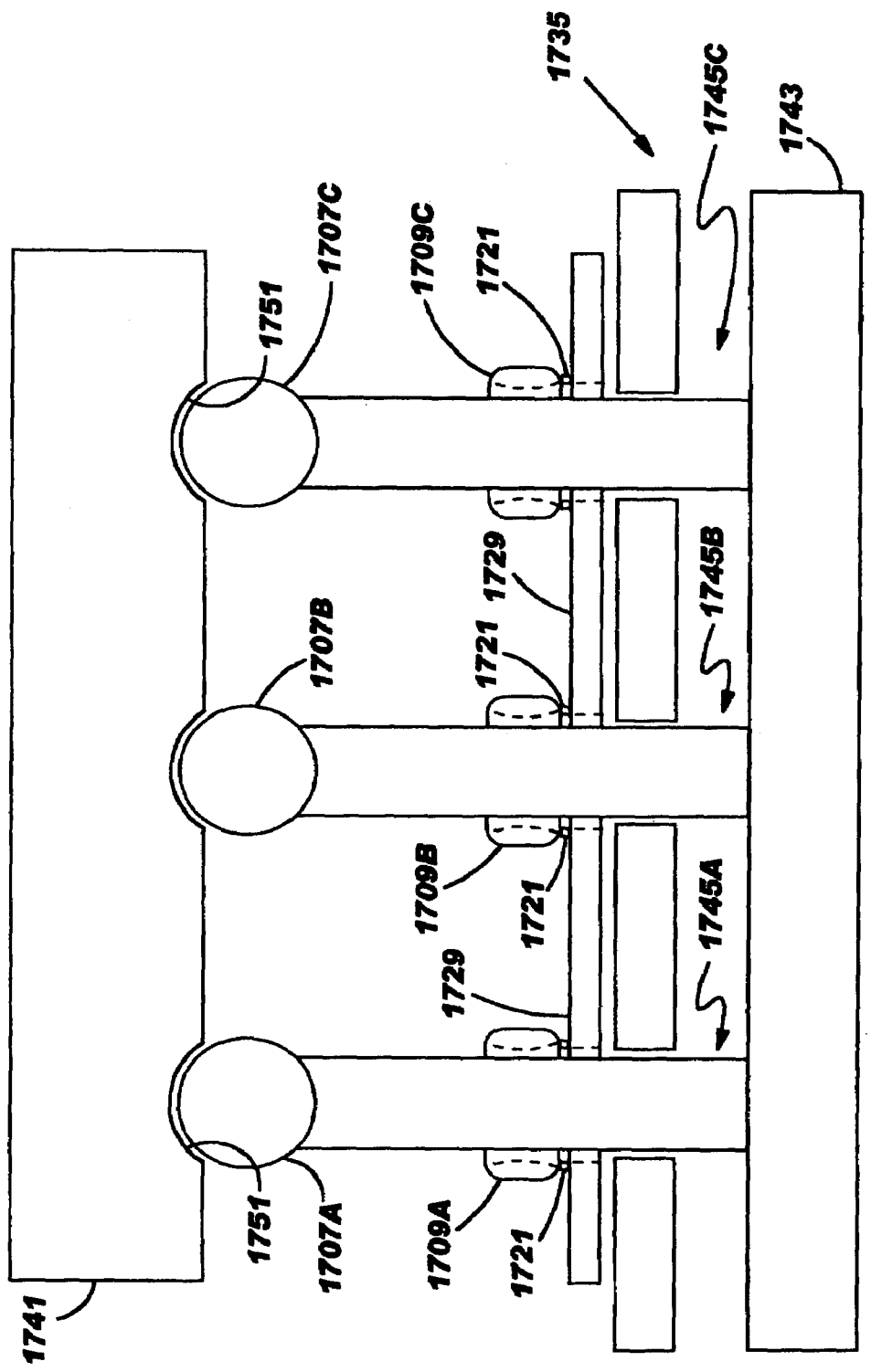
FIG. 17 is a partial side view, in elevation and on a much enlarged scale, depicting an alignment fixture in accordance with the present invention for positioning elastic sleeves on reformable solder balls.
Figure 18:
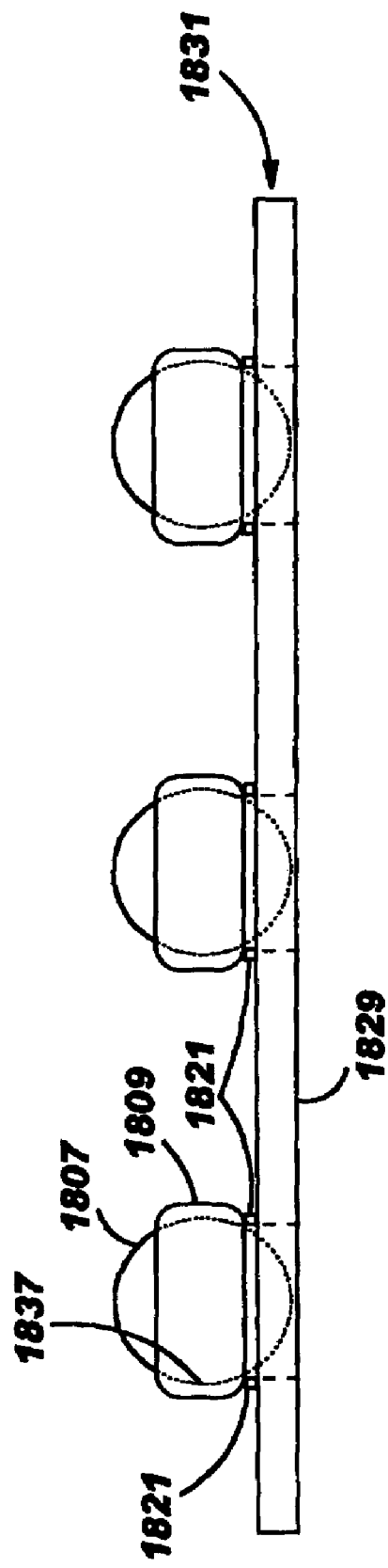
FIG. 18 is a partial side sectional view, in elevation and on a much enlarged scale, depicting elastic sleeves with a connector positioned on reformable solder balls in accordance with the present invention.

For some applications, reformable balls which are not initially bonded to contact pads can be shaped with elastic sleeves according to the present invention. For example, if the reformable balls are made of a material having little surface tension or are difficult or impossible to adhere to an electronic package, reformable balls can be formed into desired shapes independent from the electronic package. In this case, a removable anisotropically conductive interposer may be needed. This is useful for various chip and wafer testing procedures. One example of this type of processing is illustrated in FIGS. 17 and 18. In FIG. 17, reformable balls are positioned on a base 1741, with an alignment fixture 1735 in conjunction with a connector 1729 which interconnects elastic sleeves 1709A, B and C. The connector 1729 remains connected to the elastic sleeves as the elastic sleeves 1709A,B, and C are pressed onto and around the reformable balls 1707A, B and C respectively. A base 1741, with recesses 1751, provides for alignment of the reformable balls and is used in conjunction with a series of pins 1745A, B and C which are held and located by a first plate 1743. As shown in FIG. 18, elastic sleeves 1709A, B and C have been positioned around reformable balls 1707A, B, and C, using the alignment fixture 1735, with the elastic sleeves being individually circumferentially stretched around the reformable balls. The girdling pressure provides friction which holds the reformable balls in place. The openings 1837A,B and C of the elastic sleeves 1709A,B and C conform to a rounded, ball-like reformable ball shape to provide retention force. In this prestressed, aligned state, a large sheet of an array of reformable balls may be easily handled, stored, transported, positioned, protected, inspected, and tested. Reformable balls may be removed, replaced as necessary, and prepared for use in joining an electronic package to another substrate. In many electronic packages, the 'pitch', or distance between one reformable ball to another is a constant (typically about 1.27 mm or about 1.00 mm for ball grid array packages) and the pattern of the placement of the balls is a simple square array. For these packages, which account for a large percentage of applications, it is possible to prepare large sheets of elastic sleeves with reformable balls pre-loaded. The desired quantity and size of reformable balls may simply be cut from the sheet as needed for various sized packaging applications. In this manner, the elastic sleeves connected by connector 1729 also become a useful packaging method for handling and transporting large numbers of reformable balls. A roll-like continuous process may be implemented to manufacture, store large quantities economically. The material chosen for the elastic sleeve, preferably cured silicon rubber, can maintain the circumferential prestress for a long period of time.

Figure 22:
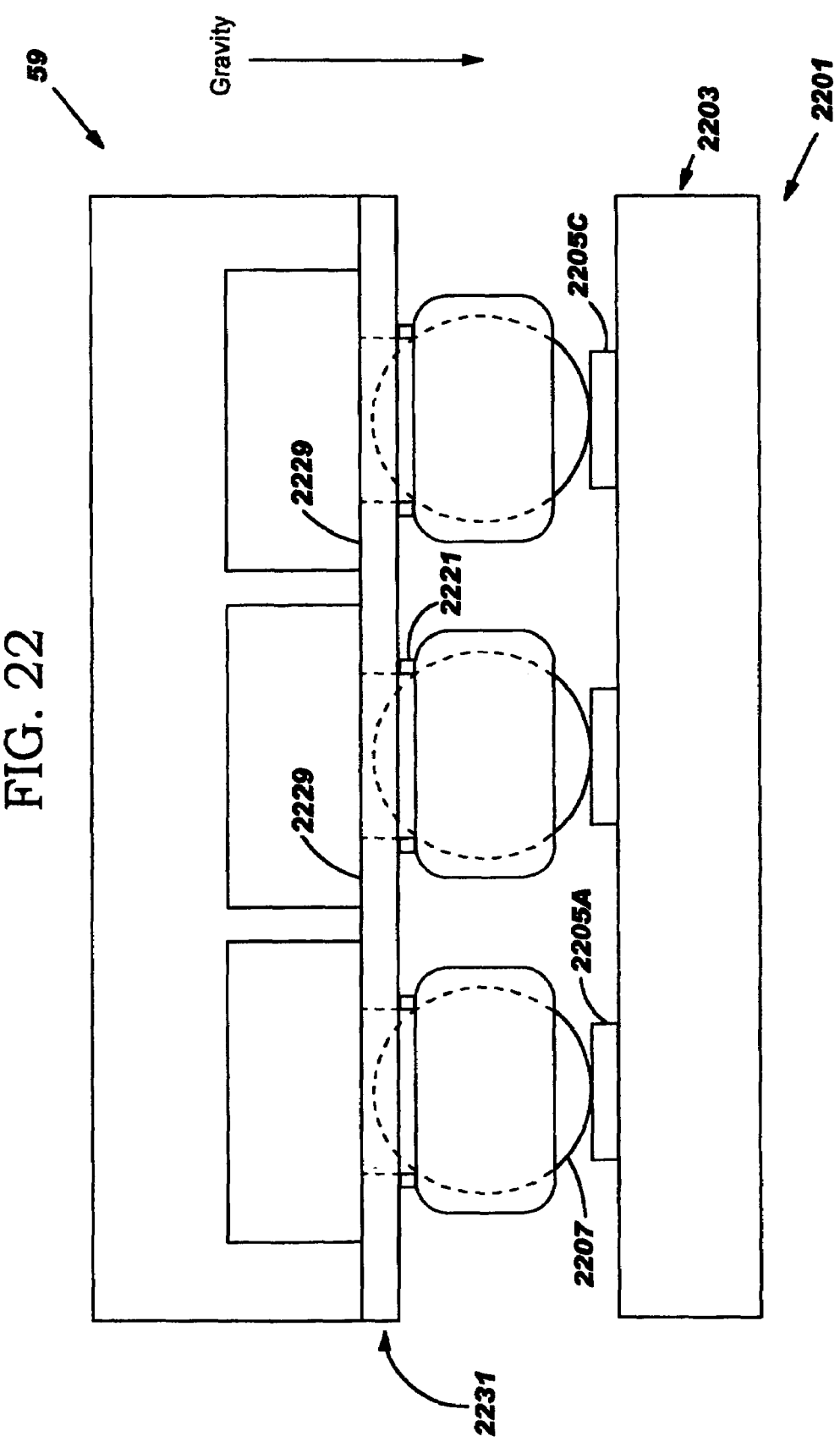
FIG. 22 is a partial side sectional view in elevation on a much enlarged scale depicting elastic sleeves with a connector positioned on reformable solder balls positioned on contact pads by the weight of a tool.

Connecting the sheet of reformable balls to an electronic package may be accomplished in one of two manners, depending on whether or not the connector 1729 is to remain in place in the final configuration. If it is desirable to remove the connector, the sheet of reformable balls with elastic sleeves attached may be positioned on contact pads 2205A, B and C of an electronic component 2203 and heated so as to melt the reformable balls releasing the elastic sleeve prestress. To avoid having surface tension push the elastic sleeves away from the component, tool 59 may be used in conjunction with gravity weight as shown in FIG. 22 to be certain that elastic sleeve will remain in place and provide enhanced standoff as described earlier. Subsequently, the connector 2229 may be removed by shearing it off at tearaway features 2221. The electronic package is then reflowed to another substrate with the elastic sleeves left in place to provide enhanced standoff and shape control.

In some applications there is no need to remove the connector between elastic sleeves. To avoid surface tension pushing the elastic sleeves out of place, it is necessary to make wetting contact between each of the contact pads on the electronic package and the reformable balls before elastic stress stored in the elastic sleeves is released, i.e., before the reformable balls are molten. This is simply accomplished by the use of a quantity of lower temperature melting material which is adhered or wetted to each reformable ball and each contact pad using, for example, a lower-melting solder paste in conjunction with application methods well-known in the industry (i.e. stencil applications). The solder paste may be rapidly applied to the one or both sides of each reformable ball while held in the sheet format.

If the reformable ball is chosen to be of a higher-melting temperature solder than the solder paste, the elastic sleeve, left in place, can serve as a protective barrier in conjunction with the shaping purpose of the present invention. For example, if a high-tin content solder paste (e.g., a eutectic paste) is used on the side of the reformable ball opposite the contact pad of an electronic component for attachment purposes, it may be desirable to maintain separation of the tin from the electronic component and the solder paste on the contact pad. Tin is metallurgically active with various other metals, and can rapidly attack and alter contact pad metallurgy and so form undesirable reaction byproducts. The elastic sleeve of the invention will prevent tin from wetting up the reformable ball during reflow and consequently will prevent the reactive tin attack on the contact pad of the electronic component. In a similar manner, silver, corrosive flux, or other harmful chemicals may be prevented from migration across the protective barrier formed by the elastic sleeve.

The present invention may also be utilized to form reformable slugs in the shape of a cone or cylinder. If the reformable slugs are made of high-melt solder, it is possible to simply leave the cone or cylindrical shapes in place on the electrical component, making use of eutectic solder paste or lower melting point solder to effect an electrical connection. A distinct advantage of the invention over prior art methods of casting or molding is that undercut features, such as hourglass shapes, may be readily produced on reformable slugs. Hourglass shapes are known to have more optimal shear stress distribution characteristics than cylinders, cones, or balls.

Figure 19:
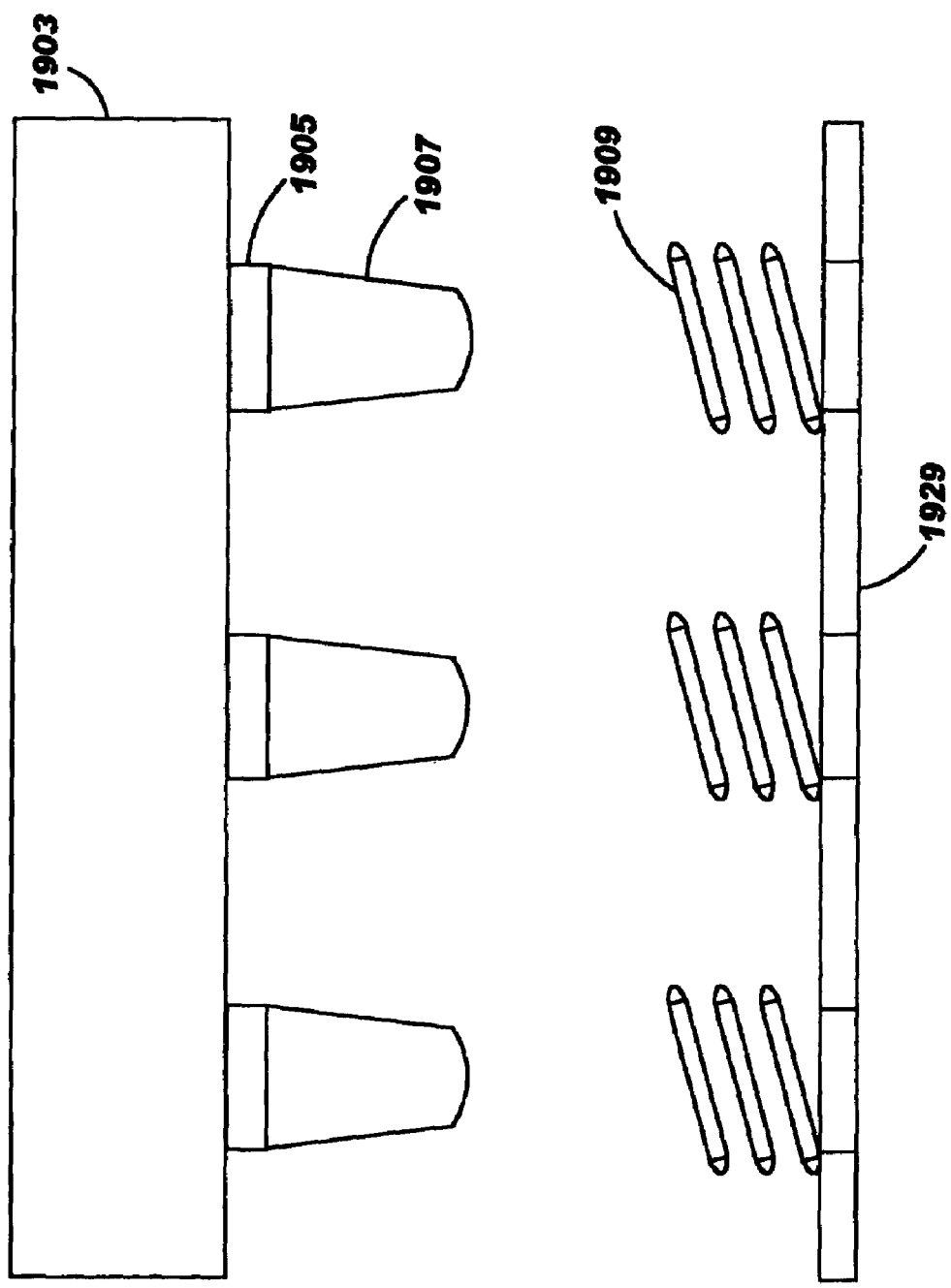
FIG. 19 is a partial side sectional view, in elevation and on a much enlarged scale, of an electronic package with several reformable solder slugs in accordance with still another embodiment of the present invention and an assembly of coiled elastic sleeves for positioning over the reformable solder slugs.
Figure 20:
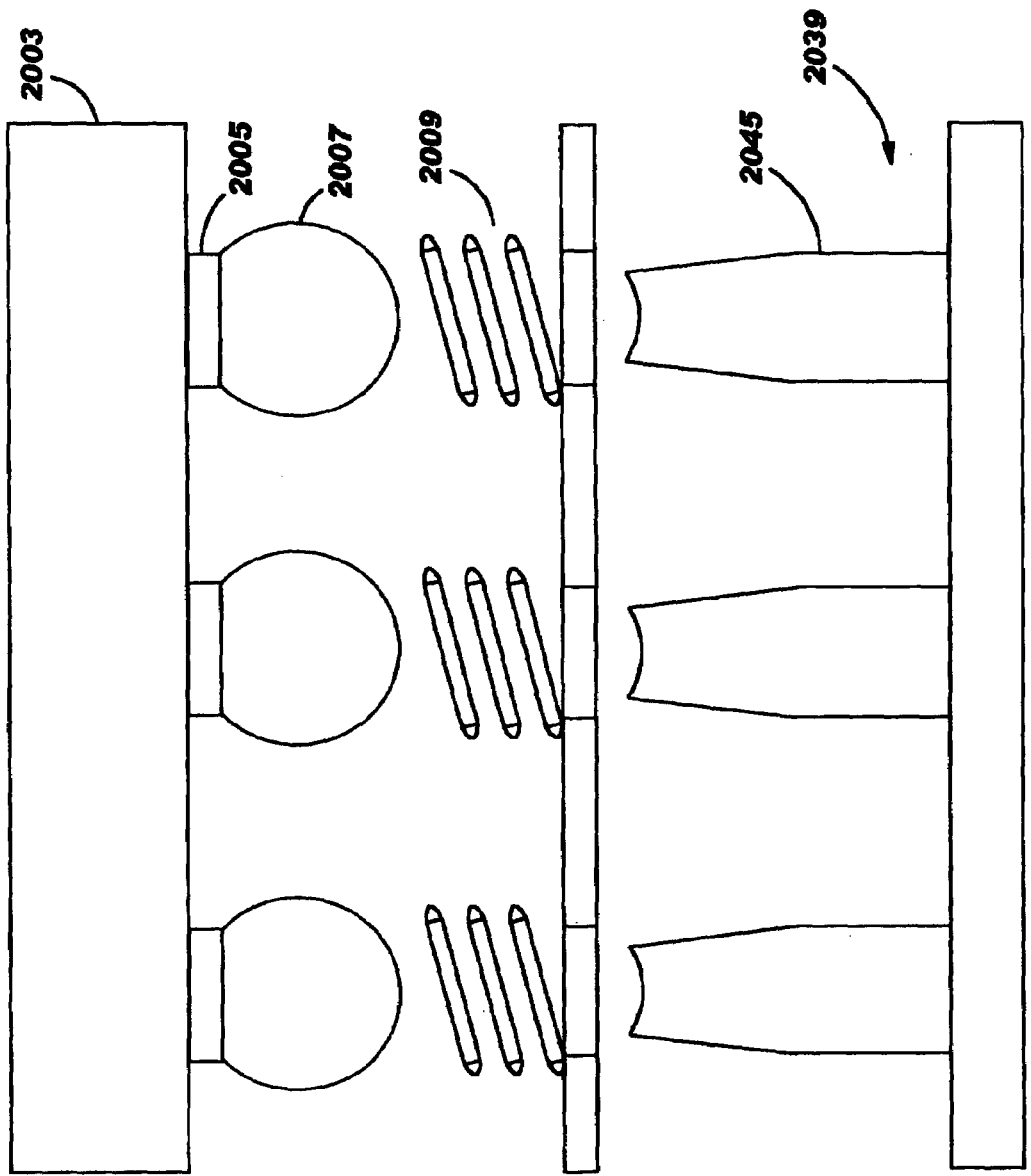
FIG. 20 is a partial side sectional view, in elevation and on a much enlarged scale, of an electronic package with several reformable solder balls in accordance with another embodiment of the present invention, depicting an assembly of coiled elastic sleeves and tapered pins for prestressing and positioning the elastic sleeves over the reformable solder balls.
Figure 21:
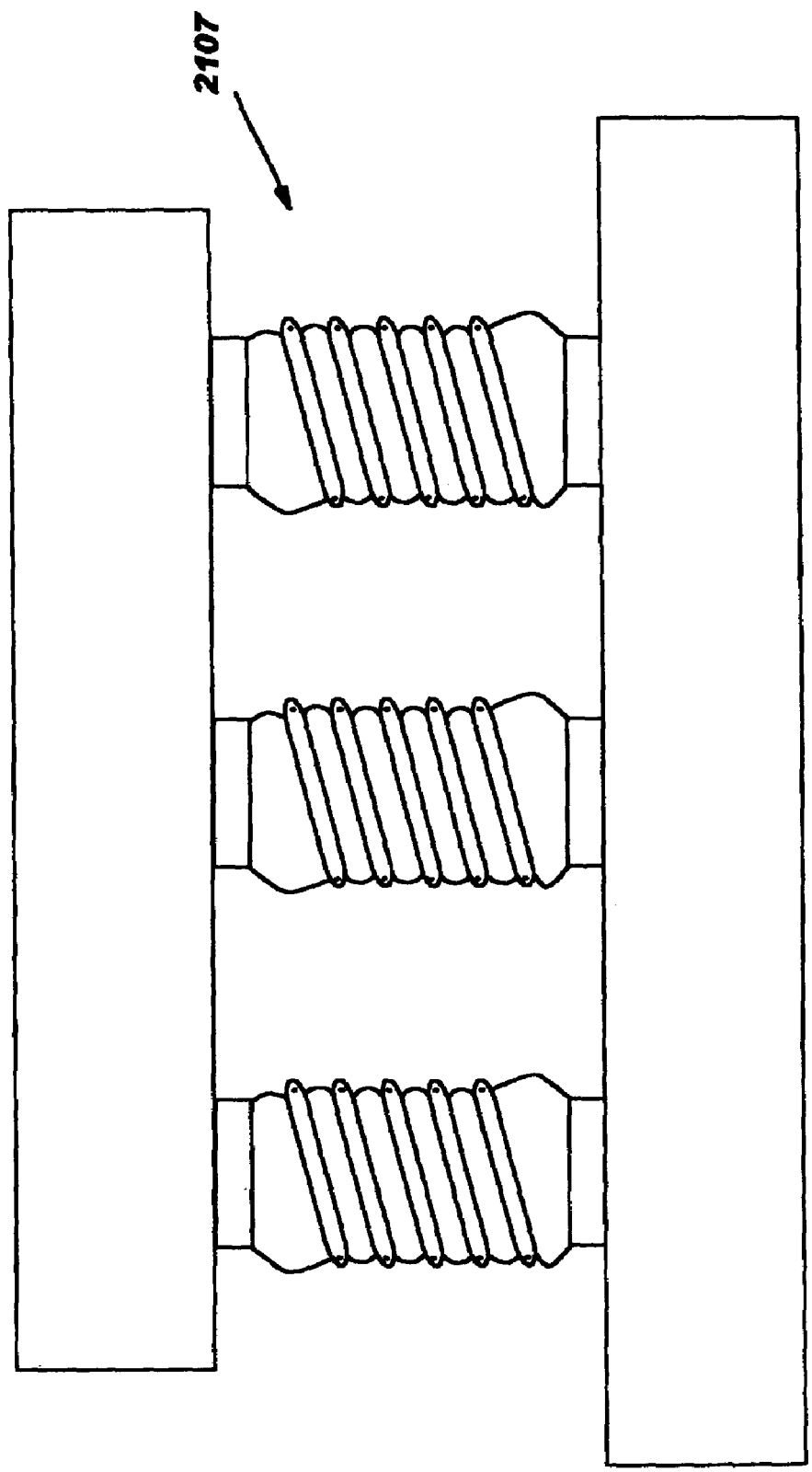
FIG. 21 is a partial side sectional view, in elevation and on a much enlarged scale, of an electronic package with several reformed solder slugs in accordance with another embodiment of the invention and coiled elastic sleeves.

A coil of soft aluminum wire, coated with polyimide or other material to which the reformable slug will not wet, may also be used as an elastic sleeve as depicted in FIG. 19. The coil 1909 is slipped into place over a tapered reformable slug 1907 and connector 1929 is removed. A coil of a shape memory alloy wire can also be utilized as elastic sleeve 2009, as illustrated in FIG. 20. A shape memory alloy is a material exhibiting the characteristic of being able to return to a particular shape, despite significant deformations, upon heating to a temperature above a critical range known as an memory activation temperature range. Known materials which exhibit this characteristic include nickel-titanium alloys. There is some hysteresis involved in the actual deformation and shape return paths followed, over a range of temperatures spanning about 20° C. to about 60° C. but essentially the original shape is recovered by heating. The memory activation temperature range which activates the material microstructural changes and cause the recovery which typically spans just a few degrees C.) of the material to its original shape may be tailored to be in a desired range by choice of alloy constituents of the material. A memory activation temperature range of about −100° C. to about +100° C. is available with known nickel-titanium materials, and deformations from the original shape involving material strains up to about 6 or 8 percent are possible to recover from. The wire may be coated with a material to prevent wetting of molten material of the reformable ball or slug. For example, a polyimide coating would prevent eutectic solder from wetting to it. A wire of this material may be formed into a coil by wrapping about a mandrel and held there while annealed (typically at about 400° C. to about 500° C. for a few minutes) so as to become 'memorized' as the 'original' or ground state for the material. The dimensions of this ground state are carefully chosen in conjunction with the quantity of material used for the reformable ball or slug and the desired final dimensions of the transformed shape of the reformed slug. Then, the coil, which comprises the elastic sleeve 2009, may be stretched and deformed so as to have a greater diameter than the reformable ball or slug. As shown in FIG. 20, tapered pins 2045 can be used to accomplish this. The prestretched elastic sleeve is then positioned around the reformable ball or slug. The wire and reformable ball or slug are then heated to a temperature which activates the shape memory alloy to constrict around the reformable ball or slug and squeeze it into a useful shape. Use of a coil wound one or more times around a reformable slug or ball can result in high aspect ratio shapes 2107, as depicted in FIG. 21. A coil with a memorized shape which is not of a uniform diameter may also be used, to create a reformable slug shape which is more useful (e.g., an hourglass shape). After memory activation, the shape memory alloy acts as a 'normal' material with a stiffness of about 5 Mpsi (million pounds per square inch) and CTE of about 6 to 11 ppm/C. A wire diameter of about 1 to about 3 mils coiled into a nominal diameter of about 10 to about 28 mils may typically be utilized in conjunction with contact pads of about 10 to about 30 mils diameter. In a manner similar to as described earlier, more than one elastic sleeve may be connected with a connector such as a sheet of water soluable paper or removable film of plastic.

Based on the foregoing, apparatus and methods for forming high stand-off or stress accommodating interconnect slugs have been disclosed. However, numerous modifications and variations may be provided without deviating from the scope of the present invention. For example various materials for reformable member, elastic member, or other portions of the invention may be substituted; shape designs may be changed so as to optimize results for specific electronic package needs; and methods may be combined and/or sequentially employed so as to form usefully shaped reformable connection members. Therefore the invention has been disclosed by way of illustration and not limitation, and reference should be made to the following claims to determine the scope of the present invention.

We claim:

1. An apparatus for positioning an elastic member substantially around a reformable member, said elastic member having an opening therein, said reformable member positioned on a base, said apparatus comprising:
   a first plate having a pin projecting into said opening of said elastic member;
   a second plate having an aperture therein and interposed between said first plate and said elastic member, said pin projecting through said aperture in said second plate, said second plate being movably positioned with respect to said pin of said first plate for removing said elastic member from said pin and positioning said elastic member substantially around said reformable member such that said reformable member is located in said opening of said elastic member.

2. The apparatus of claim 1 wherein said base is comprised of a rigid material.

3. The apparatus of claim 1 wherein said base includes a recess in which said reformable member is positioned.

4. The apparatus of claim 1 wherein said base is a substrate of an electronic package.

5. The apparatus of claim 1 wherein said first plate is comprised of a rigid material.

6. The apparatus of claim 1 wherein said pin is comprised of stainless steel, plastic, titanium or aluminum.

7. The apparatus of claim 1 wherein said pin includes a portion having a coated region of a low friction material selected from the group consisting of PTFE, graphite, oil, solder flux and water-based surfactant.

8. The apparatus of claim 1 wherein said pin has a substantially concave tip and said reformable member has a substantially convex surface area to nest on said concave tip.

9. The apparatus of claim 1 wherein said elastic member is comprised of rubber, plastic or a shape memory alloy.

10. The apparatus of claim 9 wherein said rubber comprises a silicone rubber.

11. The apparatus of claim 9 wherein said plastic is a thermally activated shrinking plastic.

12. The apparatus of claim 11 wherein said thermally activated shrinking plastic has an activation temperature in a range of about 40° to about 340° Centigrade.

13. The apparatus of claim 11 wherein said shape memory alloy has a memory activation temperature in a range of about 40° to about 340° Centigrade.

14. The apparatus of claim 1 wherein said reformable member has a general shape of a ball, a cylinder or a cone.

15. The apparatus of claim 1 wherein said elastic member has a general shape of a doughnut, a sleeve or a coil.

16. The apparatus of claim 1 wherein said first plate further includes another pin for positioning another elastic member substantially around another reformable member.

17. The apparatus of claim 16 further comprising a connector between said elastic members.

18. The apparatus of claim 17 wherein said connector comprises a tearable member removably positioned between said elastic members to align said elastic members with said reformable members.

19. The apparatus of claim 17 wherein said connector is comprised of rubber, plastic, paper or metal.

20. The apparatus of claim 19 wherein said paper is a water-soluble paper.

21. The apparatus of claim 1 wherein said reformable member comprises solder.

22. The apparatus of claim 1 wherein said reformable member comprises a material selected from the group consisting of electrically conductive epoxy, silver, gold, tin, lead, bismuth, aluminum and copper.

23. The apparatus of claim 1 wherein said reformable member comprises a thermally dependent material.

24. The apparatus of claim 23 wherein said thermally dependent material has a transition temperature in a range of about 40° to about 340° Centigrade.

25. The apparatus of claim 1 wherein said reformable member comprises a thermally dependent material.

26. The apparatus of claim 25 wherein said thermally dependent material has a transition temperature in a range of about 40° to about 340° Centigrade.

* * * * *